United States Patent
Hayashida et al.

(10) Patent No.: US 6,767,767 B2
(45) Date of Patent: Jul. 27, 2004

(54) METHOD OF MANUFACTURING A SEMICONDUCTOR DEVICE IN WHICH A BLOCK MOLDING PACKAGE UTILIZES AIR VENTS IN A SUBSTRATE

(75) Inventors: Tetsuya Hayashida, Hinode (JP); Norihiko Kasai, Sagamihara (JP)

(73) Assignees: Renesas Technology Corp., Tokyo (JP); Hitachi Hokkai Semiconductor, Ltd., Hokkaido (JP)

( * ) Notice: Subject to any disclaimer, the term of this patent is extended or adjusted under 35 U.S.C. 154(b) by 0 days.

(21) Appl. No.: 10/195,084

(22) Filed: Jul. 16, 2002

(65) Prior Publication Data
US 2003/0045030 A1 Mar. 6, 2003

(30) Foreign Application Priority Data
Aug. 31, 2001 (JP) ........................................ 2001-264481

(51) Int. Cl.[7] .............................. H01L 21/48; H05K 3/30
(52) U.S. Cl. ........................ 438/124; 438/126; 438/127; 29/841; 29/855; 29/856
(58) Field of Search .............................. 438/22, 26, 48, 438/50, 51, 106, 107, 108, 110–113, 121, 124–127; 29/841, 855, 856

(56) References Cited

U.S. PATENT DOCUMENTS

| | | | | |
|---|---|---|---|---|
| 4,504,435 A | * | 3/1985 | Orcutt ................... | 264/272.17 |
| 5,998,243 A | * | 12/1999 | Odashima et al. ........... | 438/127 |
| 6,081,997 A | * | 7/2000 | Chia et al. ................... | 29/841 |
| 6,087,202 A | * | 7/2000 | Exposito et al. ............ | 438/113 |
| 6,173,490 B1 | * | 1/2001 | Lee et al. ................... | 29/841 |
| 6,200,121 B1 | * | 3/2001 | Tsuruta ....................... | 425/127 |
| 6,262,490 B1 | * | 7/2001 | Hsu et al. ................... | 257/787 |
| 6,323,064 B1 | * | 11/2001 | Lee et al. ................... | 438/117 |
| 6,338,813 B1 | * | 1/2002 | Hsu et al. ................... | 264/272.14 |
| 6,383,846 B1 | * | 5/2002 | Shen et al. .................. | 438/127 |
| 6,413,801 B1 | * | 7/2002 | Lin ............................. | 438/127 |
| 6,462,421 B1 | * | 10/2002 | Hsu et al. ................... | 257/777 |
| 6,465,277 B2 | * | 10/2002 | Lee et al. ................... | 438/112 |
| 6,519,844 B1 | * | 2/2003 | Nagarajan et al. ............ | 29/841 |
| 2002/0092162 A1 | * | 7/2002 | Tsai et al. ..................... | 29/840 |
| 2002/0173074 A1 | * | 11/2002 | Chun-Jen et al. ........... | 438/108 |

FOREIGN PATENT DOCUMENTS

| | | | | | |
|---|---|---|---|---|---|
| JP | | 58040848 A | * | 3/1983 | ........... H01L/23/48 |
| JP | | 11297731 A | * | 10/1999 | ........... H01L/21/56 |
| JP | | 2000012578 A | * | 1/2000 | ........... H01L/21/56 |

* cited by examiner

Primary Examiner—Alonzo Chambliss
(74) Attorney, Agent, or Firm—Miles & Stockbridge P.C.

(57) ABSTRACT

A semiconductor device manufacturing method is disclosed which can reduce the cost of manufacturing an MAP type semiconductor device. According to this method, a substrate with semiconductor chips mounted at predetermined intervals in a matrix shape on a main surface thereof is clamped between a lower mold and an upper mold of a molding die, an insulating resin is injected through gates into a cavity formed on the main surface side of the substrate, air present within the cavity is allowed to escape from air vents, to form a block molding package which covers the semiconductor chips, thereafter bump electrodes are formed on a back surface of the substrate, and then the block molding package and the substrate are cut longitudinally and transversely to fabricate plural semiconductor devices. The air vents are formed by grooves provided in the substrate.

23 Claims, 19 Drawing Sheets

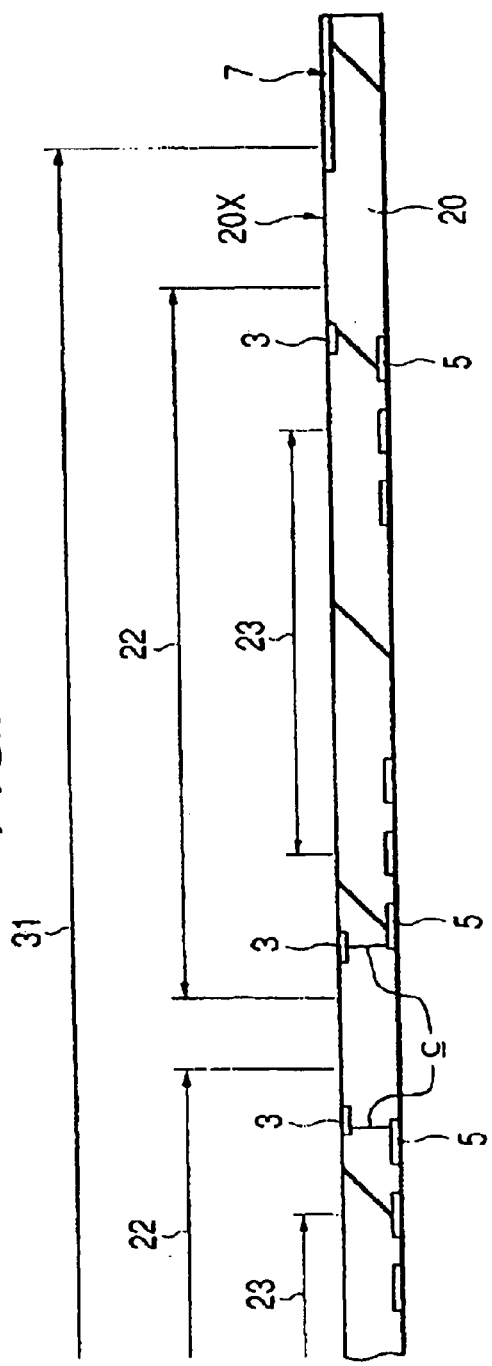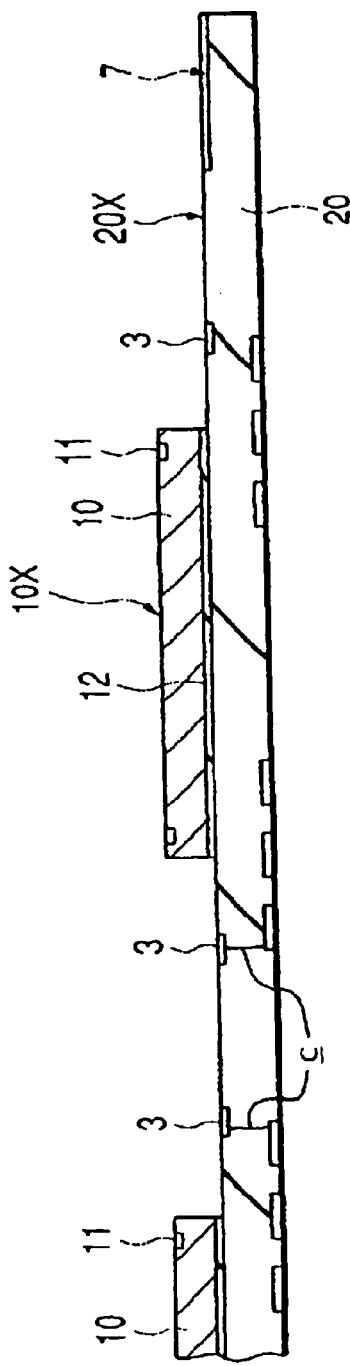

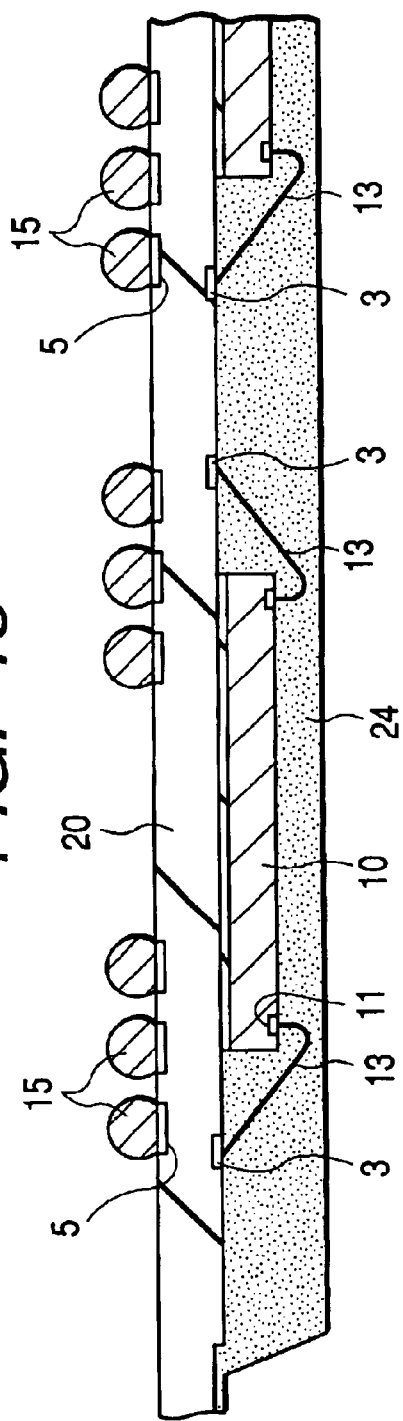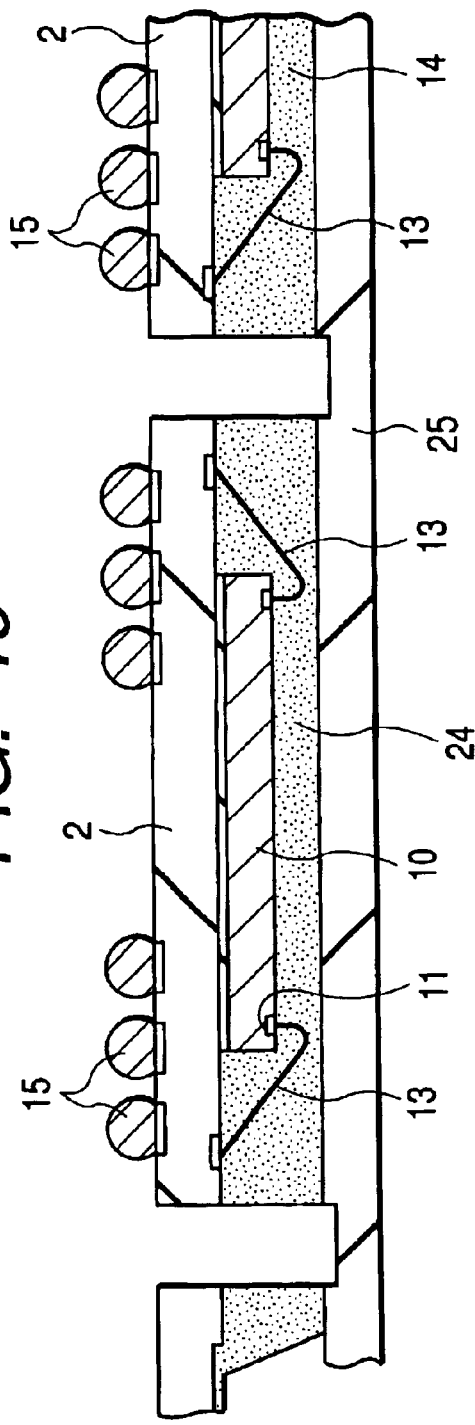

METHOD OF MANUFACTURING A SEMICONDUCTOR DEVICE IN WHICH A BLOCK MOLDING PACKAGE UTILIZES AIR VENTS IN A SUBSTRATE

BACKGROUND OF THE INVENTION

The present invention relates to a method of manufacturing a semiconductor device and more particularly to a technique which is effective in its application to a technique (MAP: Matrix Array Packaging method) of manufacturing plural semiconductor devices. According to this technique, a main surface side of a substrate with plural semiconductor chips (semiconductor elements) arranged thereon regularly in longitudinal and transverse directions is covered with a seal member (package) by block molding of an insulating resin and thereafter the substrate and the package superimposed one on the other are divided longitudinally and transversely to fabricate plural semiconductor devices.

As package forms of semiconductor devices adapted for the tendency to multi-function and higher density there are known, for example, BGA (Ball Grid Array) and CSP (Chip Size Package). As an example of a technique for fabricating such BGA and CSP there is known a semiconductor device manufacturing method comprising providing a wiring substrate, mounting a semiconductor chip (semiconductor element) at a predetermined position of a main surface of the wiring substrate, connecting electrodes on the semiconductor chip and wiring lines on the main surface of the wiring substrate with each other through electrically conductive wires, then covering the main surface side of the wiring substrate with an insulating sealing resin, and forming salient electrodes (bump electrodes) on a back surface of the wiring substrate, the salient electrodes being connected to the wiring lines.

For the purpose of reducing the semiconductor device manufacturing cost there has been adopted an MAP method comprising using a matrix type wiring substrate with product forming areas provided longitudinally and transversely in a lattice shape, mounting predetermined semiconductor chips in the product forming areas, respectively, of the matrix wiring substrate, thereafter connecting electrodes of the semiconductor chips and wiring lines on a main surface of the wiring substrate with each other through electrically conductive wires, then covering the whole of the main surface side of the matrix wiring substrate with an insulating sealing resin (block molding), forming salient electrodes (bump electrodes) on a back surface of the wiring substrate, the salient electrodes being connected to the wiring lines, and subsequently cutting the matrix wiring substrate and the package of the sealing resin longitudinally and transversely to fabricate plural semiconductor devices.

SUMMARY OF THE INVENTION

In the conventional transfer molding, including block molding, a cavity into which resin is injected, as well as gates and air vents both communicating with the cavity, are formed using a molding die.

In block molding, if an air vent is not formed correspondingly on an extension of semiconductor chips arranged in a column, the flow of resin in the cavity changes delicately, resulting in that voids remain on edges of the semiconductor chips which edges are hidden with respect to the resin flow, or unfilling of resin is apt to occur.

FIGS. 22 to 24 are schematic diagrams associated with a block molding method which the present inventor had studied before accomplishing the present invention. As shown in FIG. 22, a substrate 20 with semiconductor chips 10 arranged regularly on a main surface (an upper surface in the figure) thereof is held grippingly (mold clamping) between a lower mold 30B and an upper mold 30A of a molding die 30, whereby there are formed a cavity 31, as well as gates 32 and air vents 37 both communicating with the cavity 31. Generally, a mating surface(s) (parting surface(s)) of the upper mold 30A and/or the lower mold 30B is (are) recessed for forming the cavity 31, gates 32 and air vents 37.

In the MAP method, a molding space (cavity) including all the semiconductor chips 10 fixed to the main surface of the substrate 20 is formed on the main surface side of the substrate. On one side of the cavity 31 are arranged plural gates 32 side by side, the gates 32 serving as flow paths for guiding molten resin 8 into the cavity 31, while on another side (opposite side) opposite to the gates 32 are formed plural air vents 37 side by side, the air vents 37 serving as flow paths for guiding air 9 to the outside of the cavity 31 which air is forced out by the resin 8 flowing into the cavity 31.

FIGS. 23 and 24 are schematic diagrams showing arrangement relations among the cavity 31 formed in the substrate 20, the gates 32 and air vents 37, and the semiconductor chips 10 mounted on the main surface of the substrate 20. In FIGS. 22, 23 and 24, which illustrate arrangement relations of the substrate 20 to the semiconductor chips 10 arranged on the substrate, wires for electrically connecting electrodes on the semiconductor chips 10 with wiring lines on the substrate 20 are not shown.

FIG. 23 shows such a positional relation between semiconductor chips and air vents as permits preventing the occurrence of voids and unfilling of resin. In FIG. 23, semiconductor chips 10 are arranged regularly in a lattice shape along both long and short sides of the substrate 20 which is quadrangular. In the example illustrated in the same figure, a total of twelve semiconductor chips 10 are arranged as three rows and four columns. That is, three semiconductor chips 10 are arranged in each column from gates 32 located on one side of the cavity 31 toward air vents 37 located on another side of the cavity 31 opposite to the gates 32.

The air vents 37 are arranged correspondingly to the columns of semiconductor chips. The area between adjacent semiconductor chip columns, (chip-column-to-chip-column area), is wide as a resin flow path and encounters neither concave nor convex that obstruct the flow of resin, so that the flow velocity of resin flowing between adjacent chip columns becomes higher than that in a chip column area (a combined area of both areas where semiconductor chips are arranged and chip-to-chip areas in the columns of chips arranged in the direction in which the resin is injected). Consequently, the resin arrives so much earlier at a terminal end of the substrate 20 where the air vents 37 are arranged. Therefore, the air vents 37 are deviated from the extension of each chip-column-to-chip-column area and are arranged correspondingly to the extensions of the chip column areas.

FIG. 24 is a schematic diagram showing a substrate 20 as clamped to the molding die 30 illustrated in FIG. 23, the substrate 20 having a different arrangement of semiconductor chips. On a main surface of this substrate 20 are arranged semiconductor chips 10 regularly in seven columns and four rows. Since the air vents 37 are formed by the molding die 30, their positions do not always correspond to positions located on the extensions of chip column areas and air vents located on the extensions of chip-column-to-chip-column areas are stopped up with resin and fail to function the moment the resin reaches the terminal end of the cavity past the chip-column-to-chip-column areas. In the portions where air vents are not provided on the extensions of chip-column-to-chip-column areas, the resin passing between adjacent chip-column-to-chip-column areas involves remaining air therein and generates voids upon arrival at the terminal end of the cavity.

For solving such a problem, that is, for forming air vents correspondingly to chip columns, it is necessary to provide molding dies correspondingly to various substrates, with consequent increase of the mold cost and hence increase in the cost of the semiconductor device manufactured by the MAP method.

It is an object of the present invention to provide a semiconductor device manufacturing method in accordance with an MAP method which can reduce the mold cost.

It is another object of the present invention to provide a semiconductor device manufacturing method in accordance with an MAP method which can reduce the semiconductor device manufacturing cost.

The above and other objects and novel features of the present invention will become apparent from the following description and the accompanying drawings.

Typical inventions disclosed herein will be outlined below.

(1) A semiconductor device manufacturing method comprising the steps of:

providing a substrate, the substrate having product forming areas arranged regularly on a main surface thereof and also having wiring lines of predetermined patterns formed on main surfaces and back surfaces opposite thereto of the product forming areas, the wiring lines on the main surfaces and the wiring lines on the back surfaces being electrically connected with each other through conductors which extend through the substrate from the main surfaces to the back surfaces;

fixing semiconductor chips respectively to the product forming areas on the main surface of the substrate;

connecting electrodes formed on upper surfaces of the semiconductor chips with wiring lines formed on the main surface of the substrate electrically using electrically conductive connecting means;

clamping the substrate between a lower mold and an upper mold of a molding die in transfer molding equipment to form a cavity on the main surface side of the substrate, as well as gates and air vents connected to the cavity, then feeding molten insulating resin into the cavity through the gates and at the same time forcing out air present within the cavity to the exterior of the cavity through the air vents to form a block molding package on the main surface side of the substrate, the block molding package being formed of a single resin and covering the semiconductor chips and the connecting means;

forming salient electrodes on wiring portions on a back surface of the substrate; and dividing the substrate and the block molding package, which are superimposed one on the other, longitudinally and transversely at predetermined positions to form plural semiconductor devices, wherein grooves reaching an edge of the substrate are partially formed in a peripheral edge portion of the substrate so that the grooves form the air vents when the substrate is clamped between the lower and upper molds of the molding die.

The wiring on the substrate has plural product forming areas for the production of the semiconductor devices, which product forming areas are arranged regularly. The foregoing grooves are formed on extensions of the chip column areas of semiconductor chips fixed to the product forming areas and not formed on extensions of the chip-column-to-chip-column areas. A material is provided selectively on a surface of a base material which constitutes the substrate and each of the said grooves is formed by a portion free of the said material and portions located on both sides thereof and provided with the same material. The width of each of the grooves is smaller than the width of each semiconductor chip (e.g., about half of the chip width) and the depth thereof is about 50 $\mu$m. An inner end of each of the grooves is arranged inside the cavity at a position of about 100 $\mu$m to 1 mm from the edge of the cavity. A maximum particle diameter of a filler contained in the sealing resin is larger than the height of the air vents.

According to the above means (1), (a) the air vents can be defined by the grooves formed in the substrate. Therefore, it is no longer required for the molding die to be provided with air vents and hence it is possible to improve the versatility (sharing) of the molding die. As a result, it is possible to attain the reduction of the semiconductor device manufacturing cost.

(b) The grooves can be formed correspondingly to the arrangement of semiconductor chips on the substrate and can be formed on extensions of the chip column areas of semiconductor chips fixed to the product forming areas, not formed on extensions of the chip-column-to-chip-column areas, whereby it becomes possible to let the flow of resin appropriate within the cavity, and voids and unfilling of resin become difficult to occur. Consequently, it becomes possible to form a package of high quality and the semiconductor device manufacturing cost can be reduced.

(c) Since a material is provided selectively on the surface of the base material which constitutes the substrate and each of the foregoing grooves is defined by a portion free of the said material and portions located on both sides thereof and provided with the said material, not only the grooves can be formed accurately and easily, but also the substrate cost can be kept low.

(d) Since the maximum particle diameter of the filler contained in the sealing resin is larger than the height of the air vents, the resin which contains voids can be conducted surely to the outside of the cavity and it is possible to prevent the resin from flowing out more than necessary through the air vents. Thus, not only it is possible to prevent a wasteful consumption of the resin, but also it is possible to increase the resin injection pressure in the transfer molding process and thereby prevent the occurrence of a resin unfilled portion and large voids therein.

BRIEF DESCRIPTION OF THE DRAWINGS

FIG. 10 is a schematic sectional view taken on line b—b in FIG. 9;

FIG. 11 is a schematic sectional view showing a part of the substrate with semiconductor chips fixed to a main surface thereof;

FIG. 18 is a schematic sectional view of the substrate with salient electrodes formed on a back surface of the substrate;

FIG. 19 is a schematic sectional view showing a divided state of the resin seal member and the substrate as affixed to a dicing sheet;

DETAILED DESCRIPTION OF THE PREFERRED EMBODIMENTS

Figure 1:
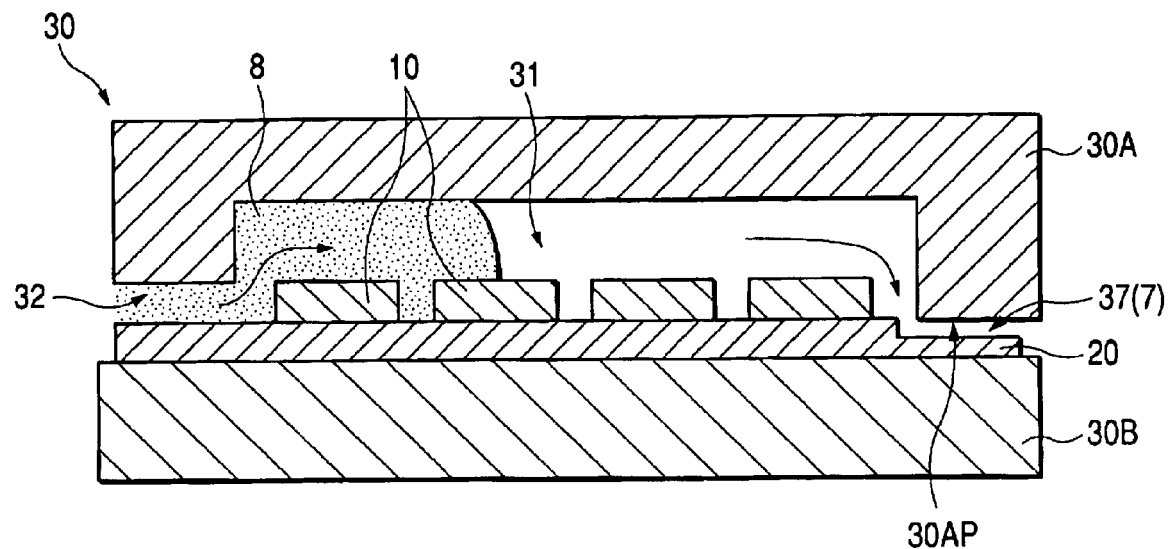
FIG. 1 is a schematic sectional view showing a block molding state using an insulating resin in a semiconductor device manufacturing method according to an embodiment (first embodiment) of the present invention.

Embodiments of the present invention will be described in detail hereinunder with reference to the accompanying drawings. In all of the drawings for illustrating the embodiments, portions having the same functions are identified by the same reference numerals and repeated explanations thereof will be omitted.

First Embodiment

FIGS. 1 to 19 illustrate a semiconductor device manufacturing method applied to MAP method according to an embodiment (first embodiment) of the present invention, of which FIGS. 1 to 5 illustrate the present invention schematically.

Figure 2:
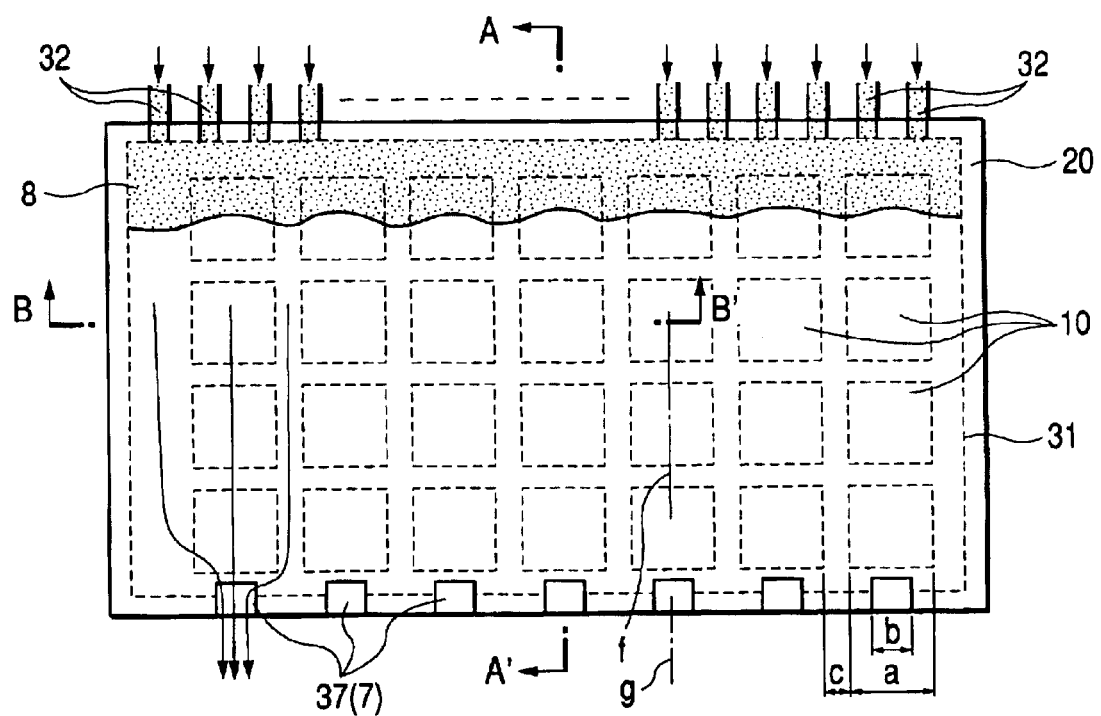
FIG. 2 is a schematic diagram showing an arrangement relation of semiconductor chips on a main surface of a substrate in the block molding state and also showing an arrangement relation of chip columns to air vents and gates.
Figure 22:
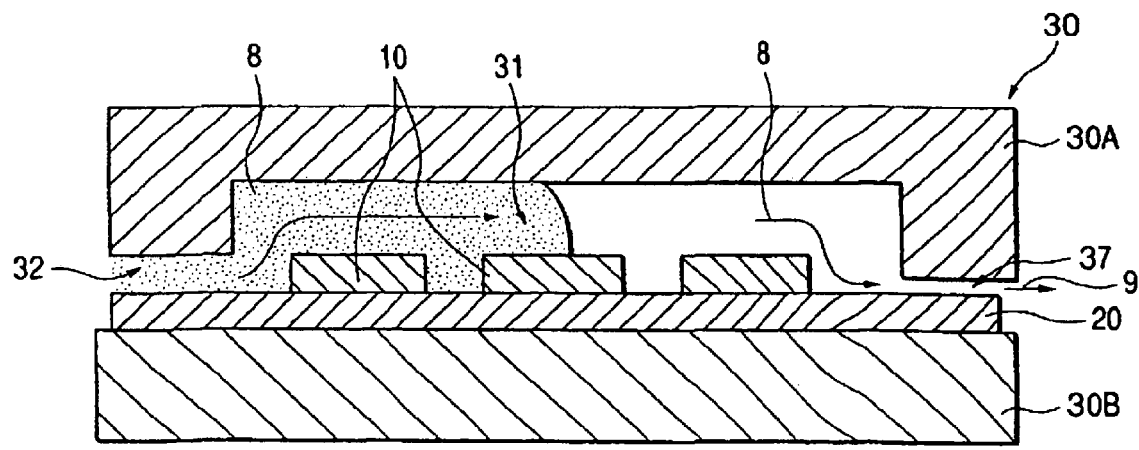
FIG. 22 is a schematic sectional view showing a block molding state using an insulating resin in a semiconductor device manufacturing method which had been studied prior to the present invention.
Figure 23:
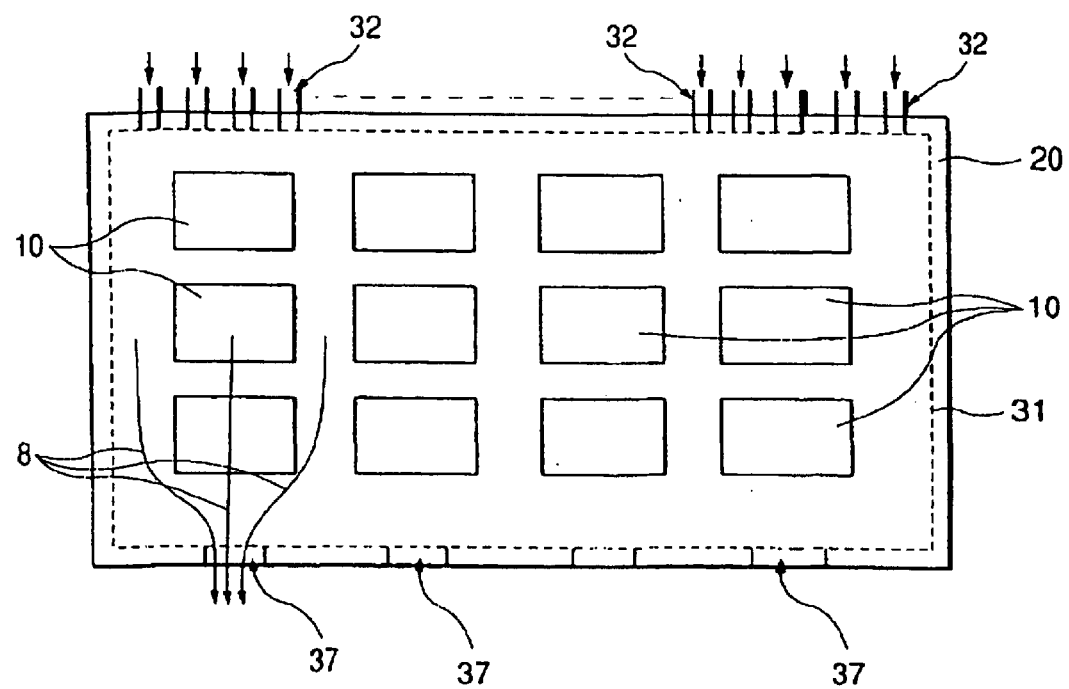
FIG. 23 is a schematic diagram showing an arrangement relation of semiconductor chips on a main surface of a substrate, as well as a good arrangement relation of chip columns to air vents and gates, in the block molding state studied prior to the present invention.
Figure 24:
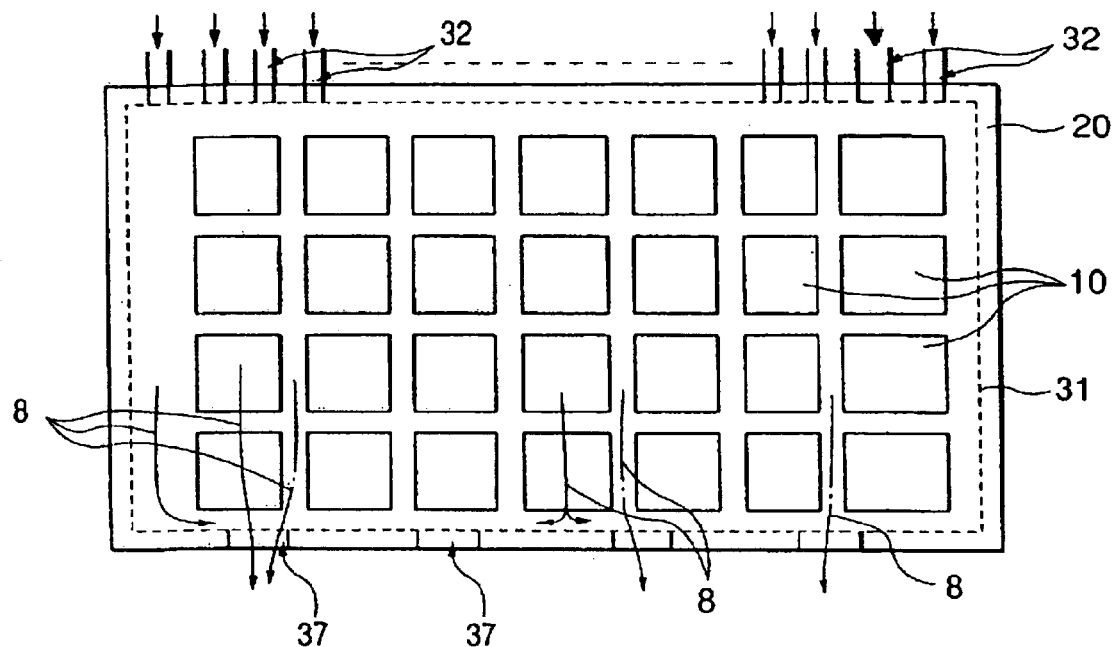
FIG. 24 is a schematic diagram showing an arrangement relation of semiconductor chips on another substrate, as well as an undesirable arrangement relation of chip columns to air vents and gates, in the block molding-state studied prior to the present invention.
Figure 25:
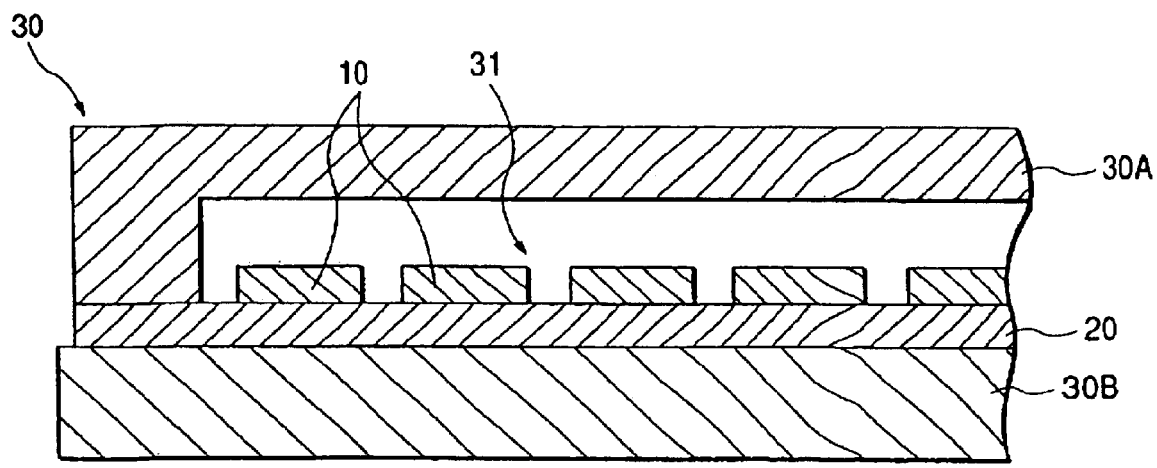
FIG. 25 is a sectional view taken on line B–B' in FIG. 2.

FIG. 1 is a schematic diagram illustrating a block molding state in the semiconductor device manufacturing method of the first embodiment and FIG. 2 is a sectional view taken on line A–A' in FIG. 2. In FIG. 1, which corresponds to FIG. 22, a substrate 20 is clamped between a lower mold 30B and an upper mold 30A. On a main surface (upper surface in the figure) of the substrate 20 are regularly arranged plural semiconductor chips 10 longitudinally and transversely in a lattice shape. FIGS. 1 to 3 and 5, like FIGS. 22 to 24, show exaggeratedly a relation of arrangement between the substrate 20 and the semiconductor chips 10 arranged thereon. Electrically conductive wires (e.g., gold wires) for electrically connecting electrodes on the semiconductor chips 10 and wiring lines on the substrate 20 with each other are omitted.

In the first embodiment, a cavity 31 and gates 32 communicating with the cavity 31 are formed by the molding die 30, but air vents 37 communicating with the cavity 31 are formed mainly by grooves 7 formed in the main surface of the substrate 20. More specifically, the air vents 37 are formed by both grooves 7 formed in the main surface of the substrate 20 and a flat parting surface of the upper mold 30A which closes the grooves 7.

The parting surface (clamping surface) of the upper mold 30A which confronts the lower mold 30B is a flat surface lying in the same plane although plural grooves constituting the gates 32 are formed therein. This flat surface lying in the same plane, indicated at 30AP, comes into contact with the main surface of the substrate 20 at the time of mold clamping. Thus, the flat surface 30AP is positioned so as to cover the grooves 7 without stopping up the grooves, whereby air vents 37 are formed between the flat surface and the grooves. In this way the gates 32 and the air vents 37 are sure to be formed.

Inner ends of the grooves 7 are positioned inside the cavity 31 with respect to an edge of the cavity. For example, inner ends of the grooves 7 are arranged inside the cavity 31 at positions of about 100 μm to 1 mm from an edge of the cavity. Consequently, air vents 37 are sure to be formed.

The grooves 7 are formed on the side opposite to the gates 32 with respect to the cavity 31, whereby it is possible to form air vents 37 in the portion where the filling of resin becomes the latest when resin 8 is injected through the gates 32.

FIG. 2 is a schematic diagram showing an arrangement relation of semiconductor chips on the main surface of the substrate in a block molding state and an arrangement relation of chip columns to air vents and gates. In FIG. 2, semiconductor chips 10 are arranged regularly in a lattice shape along both long and short sides of the substrate 20 which is quadrangular. In the same figure there is shown an example in which a total of twenty-eight, four rows by seven columns, of semiconductor chips 10 are arranged on the main surface of the substrate 20.

In this construction, four semiconductor chips 10 are arranged in the column direction from the gates 32 formed on one side of the cavity 31 up to the opposite side of the cavity opposite to the gates 32.

Though not shown, the substrate 20 has wiring lines of predetermined patterns on its main surface and back surface opposite thereto. There is adopted a wiring substrate structure in which the wiring lines on the main surface and the back surface are electrically connected with each other through conductors which extend through the substrate from the main surface to the back surface. See, e.g., conductors c in FIGS. 10 and 11. The wiring lines of predetermined patterns have plural product forming areas for the production of semiconductor devices. The product forming areas are arranged in a lattice shape. The substrate 20 is in a quadrangular shape as shown in FIG. 2 and the product forming areas (not shown) are also quadrangular. One side of each product forming area is parallel to one side of the substrate 20.

Each semiconductor chip 10 is mounted centrally of each product forming area though this constitutes no special limitation. Though not shown, electrodes on the semiconductor chips 10 and wiring lines laid around the chips are connected together through electrically conductive wires (gold wires).

The grooves 7 are formed on extensions of chip column areas of the semiconductor chips 10 which are fixed to the product forming areas, whereby air vents 37 are formed correspondingly to the semiconductor chip columns in transfer molding.

In a clamped state of the molding die, each area between adjacent semiconductor chip columns (chip-column-to-chip-column area) is high in its space serving as a resin flow path and is free of any concave or convex which obstructs the flow of resin, so that the flow velocity of resin flowing through the chip-column-to-chip-column area becomes higher than that in the chip column areas and the resin arrives so much earlier at a terminal end (a long side in the illustrated example) of the substrate 20 where the air vents 37 are arranged. Therefore, by arranging the air vents 37 (grooves 7) correspondingly on the extensions of chip columns while deviating them from the extensions of chip-column-to-chip-column areas (c), an exhaust resistance of air in the chip-column-to-chip-column areas (c) increases and hence it is possible to diminish the difference in flow velocity between the resin 8 flowing in each chip-column-to-chip-column area (c) and the resin 8 flowing in each chip column area. In more particular terms, each groove 7 is disposed so that a center line, g, thereof is aligned with an extension line of a center line, f, of each chip column area (see FIG. 2).

Moreover, as shown in FIG. 2, the width, b, of each groove 7 is smaller than the width, a, of each semiconductor chip 10. For example, the width of each groove 7 is about half the width of each semiconductor chip 10. As the sealing resin there is used a thermosetting epoxy resin for example. A maximum particle diameter of a filler contained in the sealing resin is larger than the height of each air vent 37 to prevent the sealing resin from flowing out more than necessary from the air vents 37 and thereby prevent the waste of the resin. Besides, it is possible to increase the injection pressure of resin 8 in the transfer molding process and thereby prevent the occurrence of an unfilling portion and large voids in the resin. Therefore, for example, the depth of each groove 7 is set at 50 μm or so.

As shown in FIG. 32, the gates 32 are arranged in a large number and in a closely spaced relation so that the resin 8 is fed more uniformly throughout the entire width of the cavity 31. An arrangement pitch of the gates 32 is set smaller than that of the semiconductor chips 10.

Figure 3:
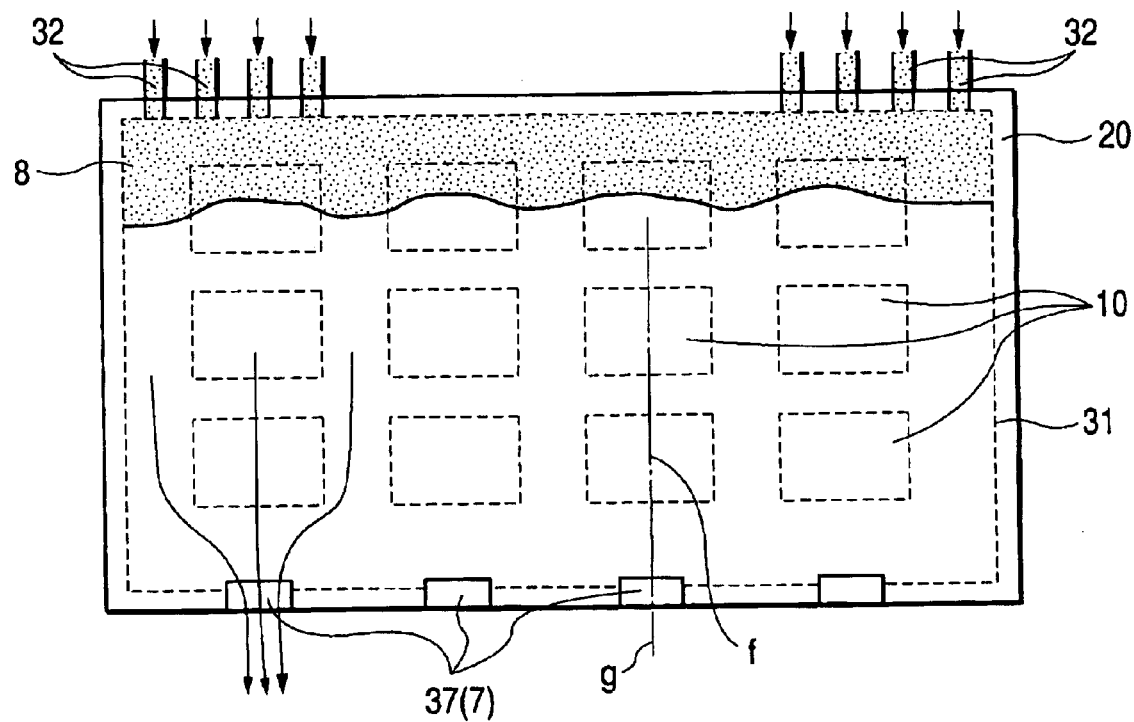
FIG. 3 is a schematic diagram showing an arrangement relation of semiconductor chips on another substrate in the block molding state and also showing an arrangement relation of chip columns to air vents and gates.

According to this first embodiment, when the size of the substrate 20 is within a predetermined dimensional range, block molding can be done for each substrate 20 with use of the same molding die 30. For example, the substrates 20 shown in FIGS. 2 and 3 are the same in external size. The substrate 20 shown in FIG. 2 is with semiconductor chips 10 arranged at narrow pitches, including a total of twenty-eight, four rows by seven columns, of semiconductor chips 10, while the substrate 20 shown in FIG. 3 is with semiconductor chips 10 arranged at wide pitches, including a total of twelve, three rows by four columns, of semiconductor chips 10.

The cavity 31 and the gates 32 are formed by the molding die 30, while the air vents 37 are formed mainly by the grooves 7 provided in the substrate 20. Since the grooves 7 formed in each substrate 20 are positioned respectively on extensions of the chip column areas of semiconductor chips 10 fixed to the product forming areas, it is possible to effect a block molding which makes the occurrence of voids and unfilling of resin difficult.

Next, with reference to FIGS. 4(A) to 4(E), a description will be given of structural examples of grooves 7 formed in the substrate 20. FIGS. 4(A) to 4(E) are schematic diagrams showing examples (five examples) of grooves 7 formed in accordance with the present invention. As to the grooves 7, a material is provided selectively on the surface of the base material which constitutes the substrate 20 and each groove is formed by both a portion free of the said material and portions located on both sides thereof and provided with the said material.

Figure 4A:
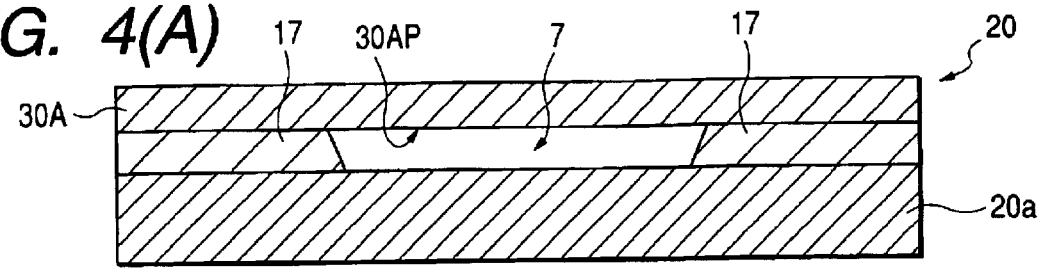
FIGS. 4(A) to 4(E) are schematic sectional views showing grooves of various structures for forming air vents in a substrate which is used in the semiconductor device manufacturing method of the first embodiment.

FIG. 4(A) shows an example in which a groove 7 is formed by portions provided with an insulating layer (e.g., solder resist) 17 on a surface of a base material 20a which constitutes the substrate 20 and a portion not provided with the insulating layer 17. In other words, the groove 7 is formed by the base material 20a and portions of the insulating layer 17 spaced apart a predetermined distance from each other on the base material. The insulating layer 17 is formed at a thickness of 25 to 30 μm for example. In this structure, the insulating layer 17 is crushed by clamping of the molding die and the groove 7 is thereby changed into an air vent 37 having a depth of about 10 μm. The width of the groove 7 is set at an appropriate value.

Figure 4B:
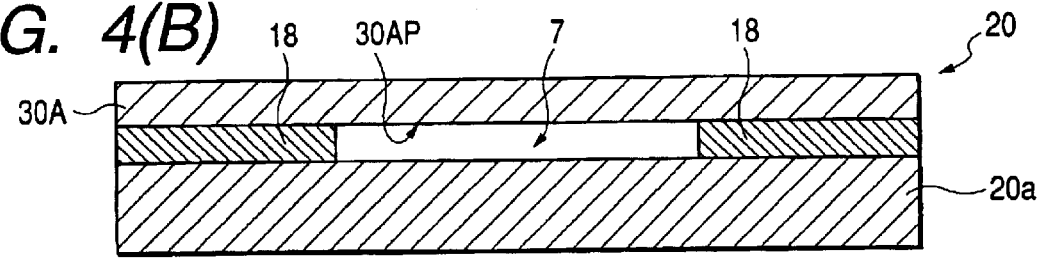

FIG. 4(B) shows an example in which a groove 7 is formed by portions provided with a conductor layer 18 on a surface of the base material 20a which constitutes the substrate 20 and a portion not provided with the conductor layer 18. In other words, the groove 7 is formed by the base material 20a and portions of the conductor layers 18 spaced apart a predetermined distance from each other on the base material. A copper layer as the conductor layer is formed at a thickness of 25 to 30 μm for example. In this structure, the copper layer is crushed by clamping of the molding die and the groove 7 is thereby changed into an air vent 37 having a depth of about 10 μm. The width of the groove 7 is set at an appropriate value.

Figure 4C:
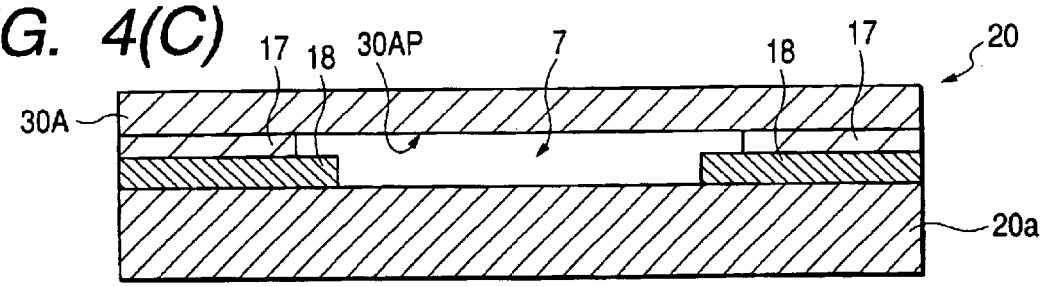

FIG. 4(C) shows an example in which a groove 7 is formed by portions provided with the conductor layer 18 on the surface of the base material 20a which constitutes the substrate 20, a portion not provided with the conductor layer 18, and portions of the insulating layer 17 formed on the conductor layer 18. Ends of the insulating layer 17 are retracted from ends of the conductor layer 18. Also in this example the width of the groove and the widths of the conductor layer 18 and insulating layer 17 are set at appropriate values.

Figure 4D:
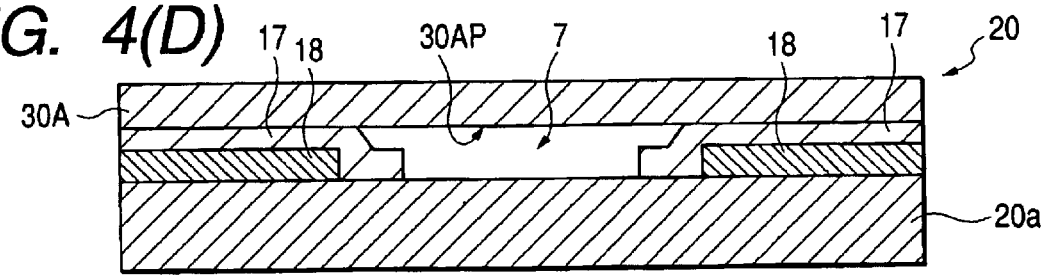

FIG. 4(D) shows an example in which a groove 7 is formed by portions provided with the conductor layer 18 on the surface of the base material 20a which constitutes the substrate 20, a portion not provided with the conductor layer 18, and portions of the insulating layer 17 formed on the conductor layer 18. Ends of the insulating layer 17 project from ends of the conductor layer 18 and extend directly onto the base material 20a. Also in this example the width of the groove 7 and the thicknesses of the conductor layer 18 and insulating layer 17 are set at appropriate values.

Figure 4E:
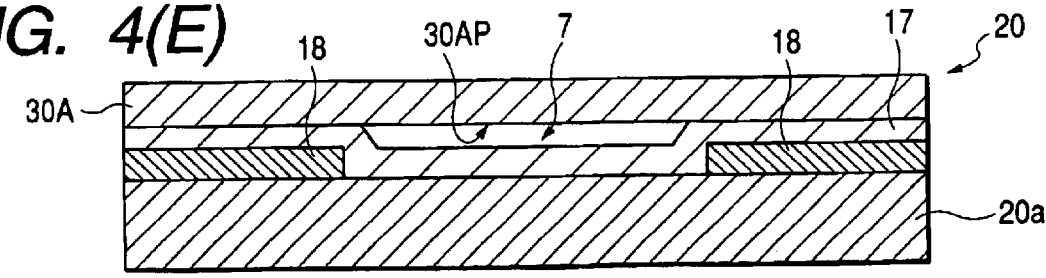

FIG. 4(E) shows an example in which a groove 7 is formed by portions provided with the conductor layer 18 on the surface of the base material 20a of the substrate 20, a portion not provided with the conductor layer 18, and the insulating layer 17 formed not only on the conductor layer 18 but also on the base material 20a. In this example, the thickness of the conductor layer 18 corresponds approximately to the depth of the groove 7. Also in this example the thicknesses of the conductor layer 18 and insulating layer 17 and the width of the groove 7 are set at appropriate values.

Figure 5:
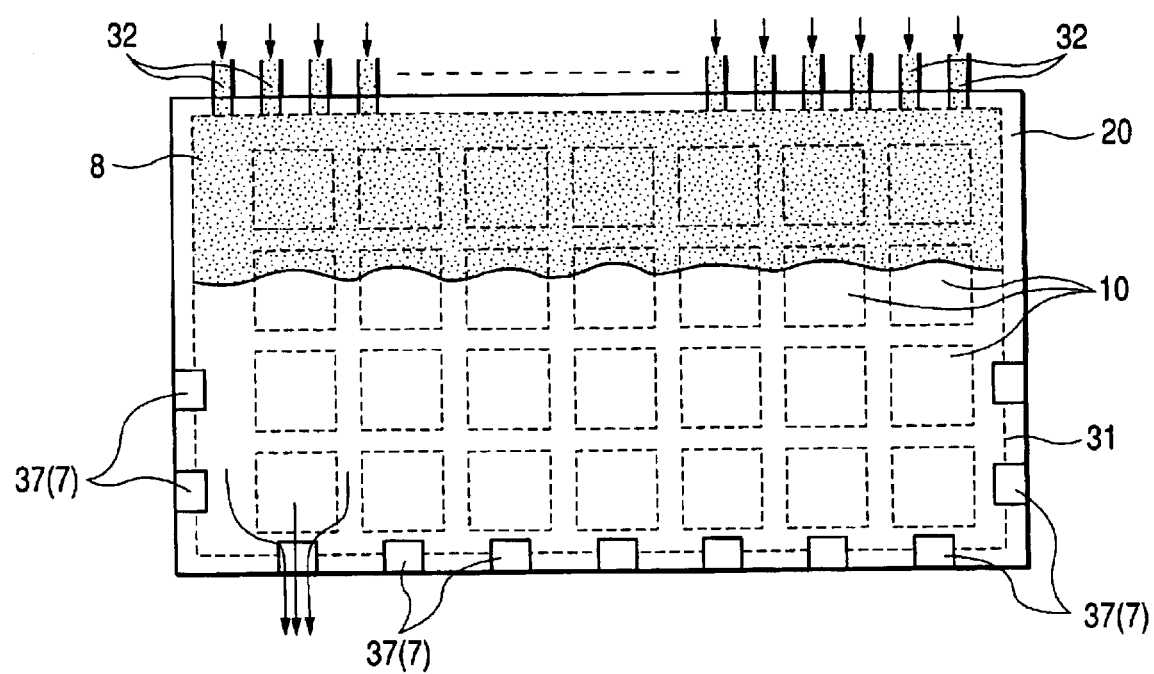
FIG. 5 is a schematic plan view showing another example of arrangement of grooves for forming air vents in a substrate which is used in the semiconductor device manufacturing method of the first embodiment.

FIG. 5 is a schematic plan view showing another arrangement example of grooves for forming air vents in the substrate used in the semiconductor device manufacturing method of the first embodiment. In this example, grooves 7 are formed not only on the side opposite to the gates 32 with respect to the cavity 31 but also on both right and left sides in the figure. More specifically, also on both right and left sides are formed grooves 7 in positions close to the side opposite to the gates 32. This arrangement is effective in further diminishing the difference in flow velocity of the resin 8 injected from the gates 32, whereby the occurrence of voids and unfilling of resin can be prevented. Thus, in this example, the grooves 7 are formed in three sides of the quadrangular cavity 31 except the side where the gates 32 are formed.

Next, with reference to FIGS. 6 to 19, a description will be given below about a more concrete semiconductor device manufacturing method according to this first embodiment. Reference will be made below to an example in which the present invention is applied to a BGA type semiconductor device.

Figure 6A:
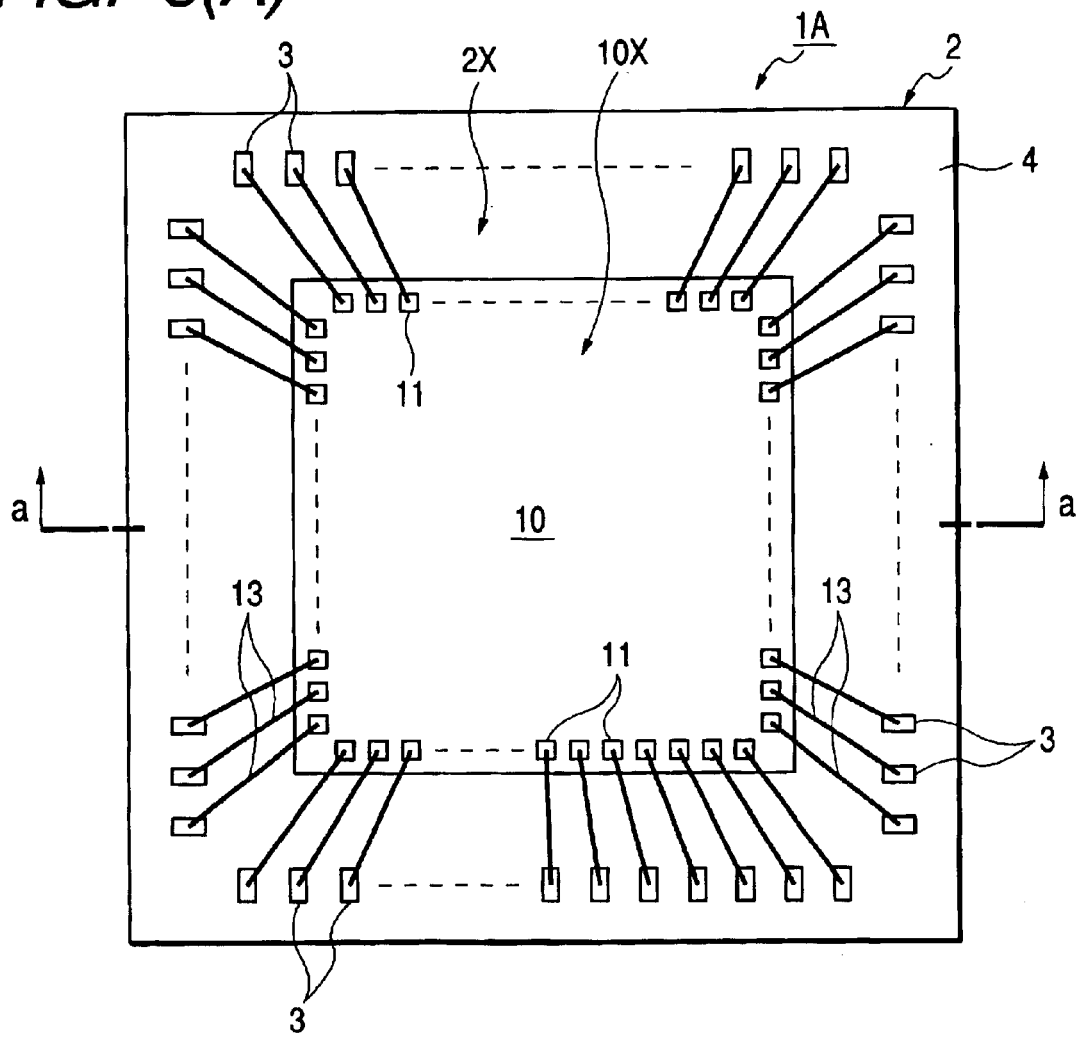
FIGS. 6(A) and 6(B) are a schematic plan view and a schematic sectional view, respectively, showing a schematic construction of a semiconductor device in the first embodiment.
Figure 6B:
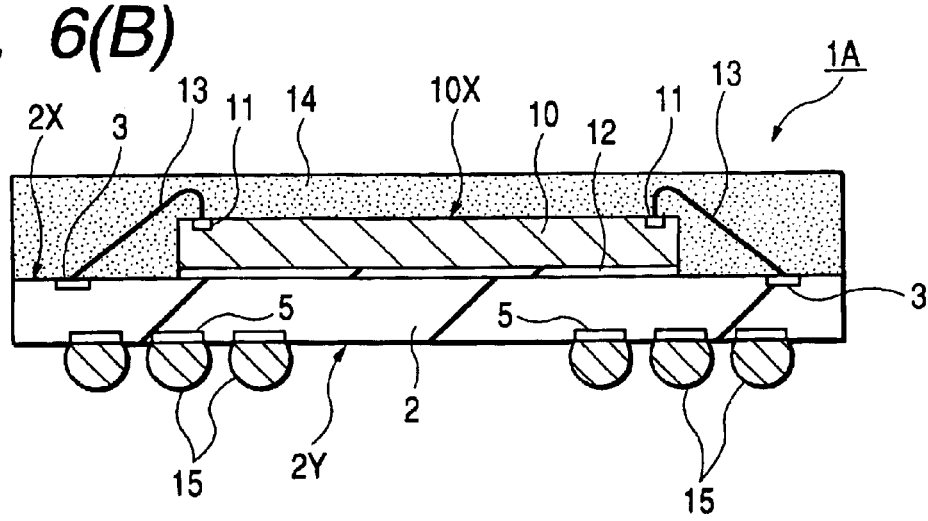
Figure 7:
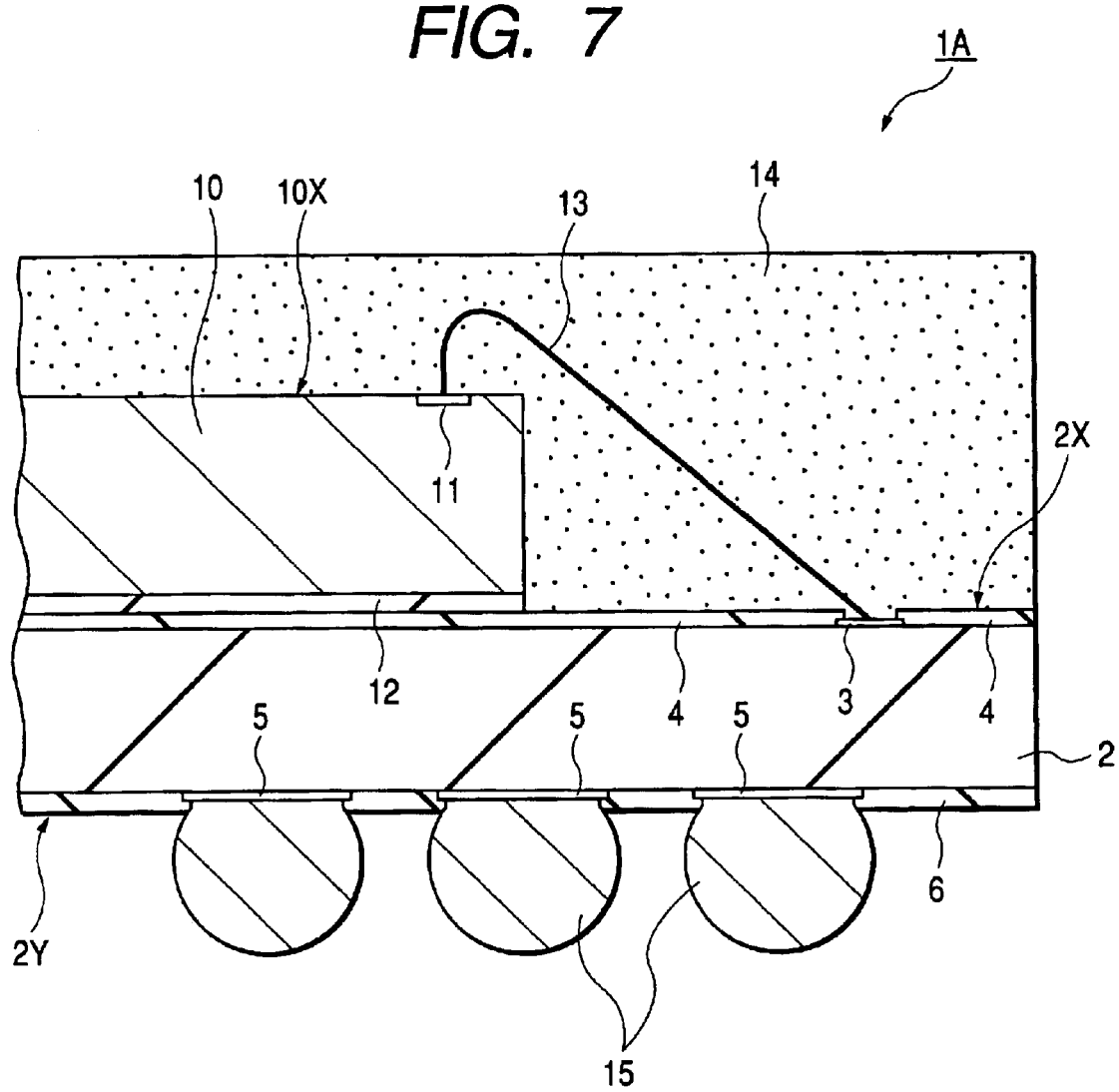
FIG. 7 is a partially enlarged schematic sectional view of FIG. 6(B)

FIGS. 6(A) and 6(B) illustrate schematic construction of a semiconductor device according to the first embodiment of the present invention, in which FIG. 6(A) is a schematic plan view showing a removed state of a resin seal member and FIG. 6(B) is a schematic sectional view taken along line a—a in (A). FIG. 7 is a partially enlarged, schematic sectional view of FIG. 6(B).

As shown in FIGS. 6 and 7, the semiconductor device according to this embodiment, indicated at 1A, mainly comprises a substrate (wiring substrate) 2, a semiconductor chip 10, plural wires (bonding wires) 13, a resin seal member 14, and plural salient electrodes 15. The semiconductor chip 10 and plural wires 13 are sealed with the resin seal member 14.

The semiconductor chip 10 is bonded and fixed through an adhesive layer 12 to one main surface 2X out of mutually opposed one main surface (chip mounting surface) 2X and another main surface (back surface) 2Y of the substrate 2. The semiconductor chip 10 is quadrangular in plan and in this embodiment it is formed in a square shape. For example, the semiconductor chip 10 comprises a semiconductor substrate formed of a single crystal silicon, a multi-layer interconnection formed by stacking insulating layers and wiring layers each in plural stages on a circuit forming surface of the semiconductor substrate, and a surface protecting film formed to cover the multi-layer interconnection. As the surface protecting film there is used a polyimide resin film for example.

In the semiconductor chip 10 is incorporated, for example, a control circuit as an integrated circuit. The control circuit is mainly composed of a transistor formed on the circuit forming surface of the semiconductor substrate and wiring lines formed by a wiring layer.

On one main surface 10X out of mutually opposed one main surface (circuit forming surface) 10X and another mains surface (back surface) of the semiconductor chip 10 there are formed plural electrode pads (bonding pads) 11 along outer periphery sides of the semiconductor chip. The plural electrode pads 11 are formed in the top wiring layer in the multi-layer interconnection and are connected electrically to the transistor which constitutes the control circuit. The plural electrode pads 11 are each formed by a metallic film such as, for example, aluminum (Al) film or aluminum alloy film.

Though not shown in detail, the substrate 2 has a multi-layer interconnection structure comprising a successive stack of insulating layers and conductor layers. For example, each insulating layer is formed by a glass fabric-based epoxy resin board comprising glass fibers impregnated with an epoxy resin. The conductor layers are each formed by a metallic film such as copper (Cu) film for example. The substrate 2 is quadrangular in plan and in this embodiment it is square.

On one main surface 2X of the substrate 2 are arranged plural connecting portions (lands) 3 which are constituted by portions of wiring lines formed in the top conductor layer on the one main surface. Also formed on one main surface 2X of the substrate 2 is a resin film 4 which protects the wiring lines formed in the top conductor layer. In the resin film 4 are formed apertures for the exposure of surfaces of the connecting portions 3.

On a back surface 2Y of the substrate 2 are formed plural electrode pads (lands) 5 which are constituted by portions of wiring lines formed in the bottom conductor layer. Also formed on the back surface 2Y of the substrate 2 is a resin film 6 which protects the wiring lines formed in the bottom conductor layer. In the resin film 6 are formed apertures for the exposure of surfaces of the electrode pads 5. The resin films 4 and 6 are formed of resin such as, for example, an epoxy resin or a polyimide resin.

Plural salient electrodes 15 are respectively fixed and connected electrically and mechanically to plural electrode pads 5 arranged on the back surface 2Y of the substrate 2. The salient electrodes 15 are formed by ball-like bumps using a solder material having a composition of Pb—Sn, for example.

The resin seal member 14 is formed quadrangular in plan and in this embodiment it is in a square shape. For the purpose of attaining a decrease of stress, the resin seal member 14 is formed of an epoxy-based thermosetting, insulating resin with a phenolic curing agent, silicone rubber and a large amount of filler (e.g., silica) incorporated therein. The resin seal member 14 may be formed of a polyimide-based thermosetting, insulating resin.

Plural electrode pads 11 arranged on one main surface 10X of the semiconductor chip 10 are respectively connected electrically through bonding wires 13 to plural connecting portions 3 arranged on one main surface 2X of the substrate 2. As the boding wires 13 there are used gold (Au) wires for example. As a method for connecting the bonding wires 13 there is here adopted a ball bonding (nail head bonding) method which uses both thermocompression bonding and ultrasonic vibration.

The resin seal member 14 and the substrate 2 are about the same in external size and their side faces are flush with each other. According to the method for manufacturing the semiconductor device 1A adopted in this embodiment, although a detailed description will be given below, plural semiconductor chips 10 mounted at predetermined intervals on one main surface of the substrate are together sealed with resin and thereafter the resin seal member and the substrate are divided at a time for each semiconductor chip 10 (for each product forming area) to obtain the semiconductor device 1A.

Figure 8:
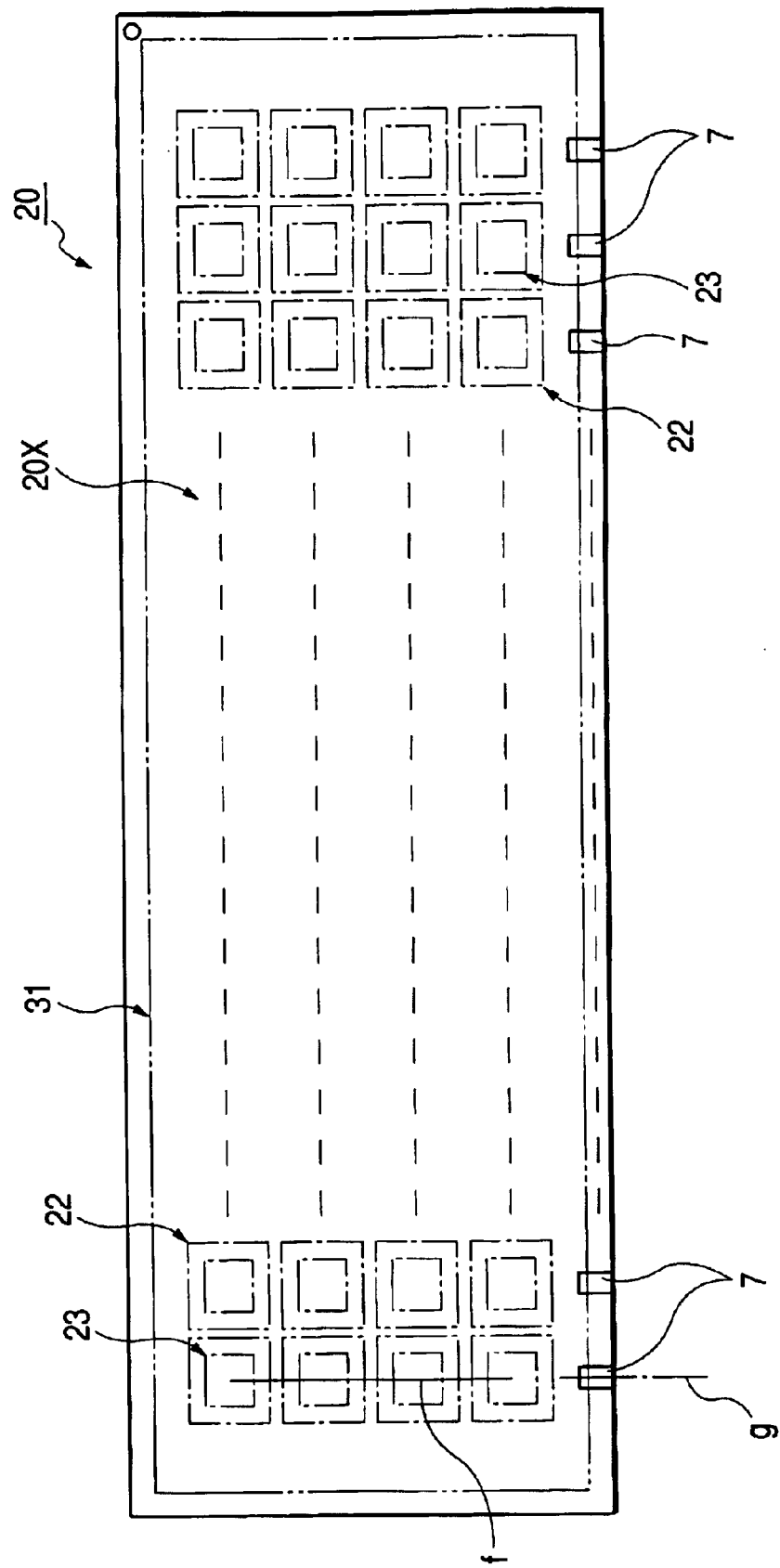
FIG. 8 is a schematic plan view of a substrate used in manufacturing the semiconductor device in the embodiment.

Next, a description will be given of the method for manufacturing the semiconductor device 1A according to this first embodiment. FIG. 8 is a schematic plan view of a substrate (wiring substrate) 20 used in manufacturing the semiconductor device 1A according to this embodiment, FIG. 9 is a partially enlarged, schematic plan view of FIG. 9, and FIG. 10 is a schematic sectional view taken on line b—b in FIG. 9.

Figure 9:
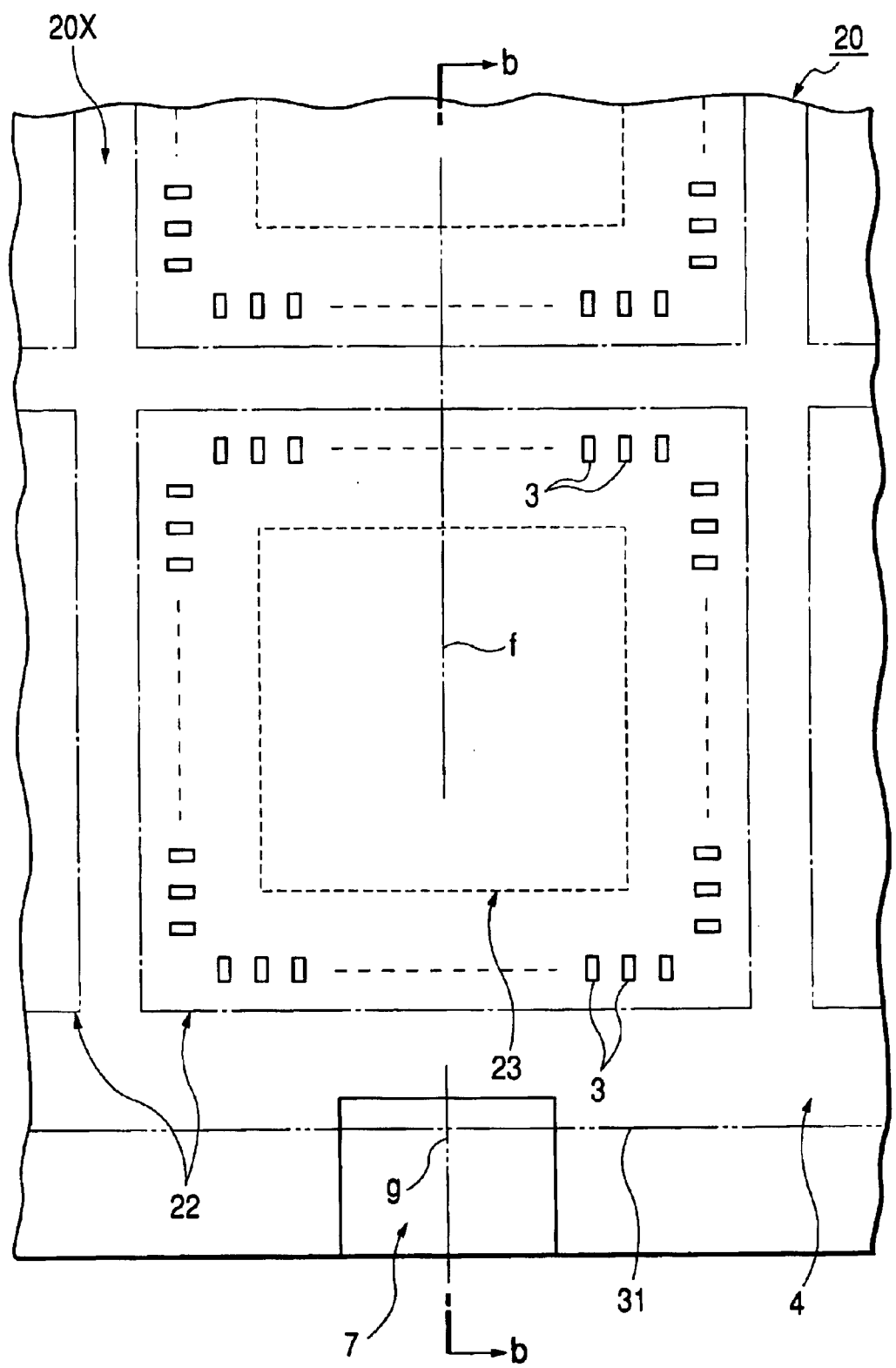
FIG. 9 is a partially enlarged schematic plan view of FIG. 8.

As shown in FIGS. 8 to 10, the substrate (wiring substrate) 20 is quadrangular in plan and in this embodiment it is in a rectangular shape. On one main surface (chip mounting surface) 20X of the substrate 20 are formed plural product forming areas 22 in a matrix shape at predetermined intervals. A chip mounting area 23 is disposed in each of the product forming areas 23 and plural connecting portions 3 are arranged around it (not shown in FIG. 8). The portion of each product forming area 22 is finally cut off into the substrate 2 of the semiconductor device 1A shown in FIG. 6.

Thus, the construction of each product forming area 22 is the same as that of the substrate 2. That is, a resin film (4) is formed throughout the whole of one main surface 20X of the substrate 20, while a resin film (6) is formed throughout the whole of another main surface (back surface) opposed to the one main surface 20X. The product forming areas 22 are spaced apart from one another through separating areas which are for dividing the substrate 20. One side of each product forming area 22 is parallel to one side of the substrate 20.

In manufacturing the semiconductor device 1A, a resin seal member (a block molding package) having a predetermined certain thickness is formed by transfer molding on one main surface 20X of the substrate 20. A cavity (sealing area) 31 which forms the block molding package is indicated by a frame of a dash-double dot line in FIG. 8. One main surface 20X side of the substrate 20 is covered with the block molding package exclusive of edge portions of a predetermined width of the substrate 20. Therefore, the product forming areas 22 are disposed within the sealing area (cavity) 31 in which the resin seal member is formed.

On one main surface 20X of the substrate 20, grooves 7 for constituting air vents are formed respectively on extensions of the rows of chip mounting areas 23. This is one of features of the present invention. In this embodiment, chip mounting areas 23 are arranged in a matrix shape of n columns by four rows on one main surface 20X of the substrate 20. Therefore, the grooves 7 are formed respectively on extension lines of n columns so as to extend from positions slightly inside the sealing area 31 toward an edge of the substrate 20. The grooves 7 are shown in more detail in FIGS. 9 and 10.

In FIG. 8, the grooves 7 are formed on a lower side (long side) of the substrate 20 which is rectangular. Further, the grooves 7 are formed so as to satisfy the foregoing conditions illustrated in FIGS. 1 to 4. That is, the center line, g, of each groove 7 is in alignment with the center line, f, of the corresponding row of chip mounting areas 23. The width of each groove 7 is narrower than the width of each semiconductor chip. For example, it is half of the width of each semiconductor chip. In this case, since the width of each chip mounting area 23 is the same as the width of each semiconductor chip, the width of each groove 7 is half of the width of each chip mounting area 23. Therefore, as a matter of course, no groove 7 is present on an extension line of the chip-column-to-chip-column area located between adjacent chip mounting areas. Further, as shown in FIGS. 8 to 10, inner ends of the grooves 7 are located slightly inside the sealing area (cavity) 31. For example, inner ends of the grooves 7 are arranged inside the cavity 31 at positions of about 100 $\mu$m to 1 mm from an edge of the cavity. The depth of each groove 7 is about 50 $\mu$m.

As the construction of the grooves 7 there may be adopted any of the constructions shown in FIGS. 4(A) to (E). For example, the construction shown in FIG. 4(D) is adopted, in which both conductor layer 18 and insulating layer 17 are cut off to form each groove 7.

In the substrate 20 thus constructed, as shown in FIG. 11, each semiconductor chip 10 is fixed to each chip mounting area 23 through an adhesive layer 12. More specifically, an adhesive layer 12 constituted by an epoxy-based thermosetting resin for example is formed on each chip mounting area in each product forming area on one main surface 20X of the substrate 20, then a semiconductor chip 10 is mounted on each chip mounting area through the adhesive layer 12, followed by heat treatment, allowing the adhesive layer 12 to cure, whereby the semiconductor chip 10 is bonded fixedly to the chip mounting area. The heat treatment is conducted by heating the substrate 20 to a temperature of 150° C. or so for example.

Figure 12:
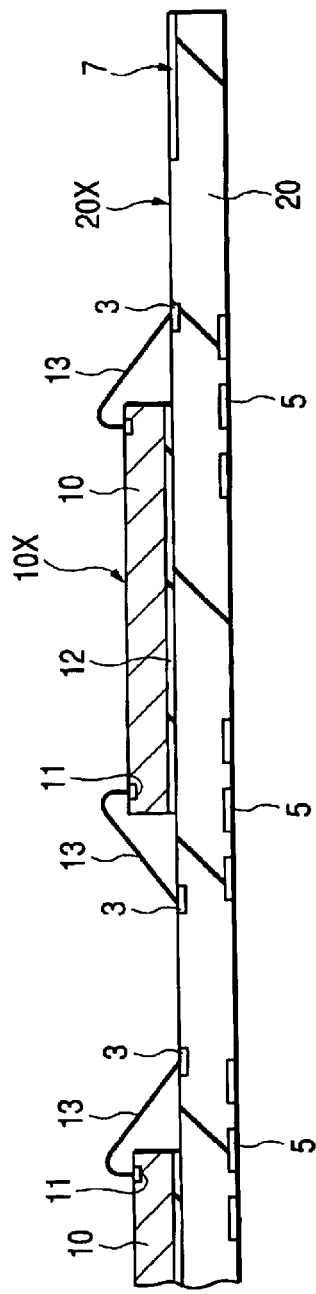
FIG. 12 is a schematic sectional view showing a part of the substrate, with electrode pads on each of the semiconductor chips and connecting portions on the substrate being connected together through wires.

Next, as shown in FIG. 12, electrode pads (bonding pads) 11 on each semiconductor chip 10 and corresponding connecting portions (lands) 3 on one main surface 20X of the substrate 20 are connected together electrically through electrically conductive wires (bonding wires) 13. As the wires there are used gold wires for example. In this wire bonding step, the substrate 20 is heated to 125° C. or so for example to improve the bonding performance.

Figure 13:
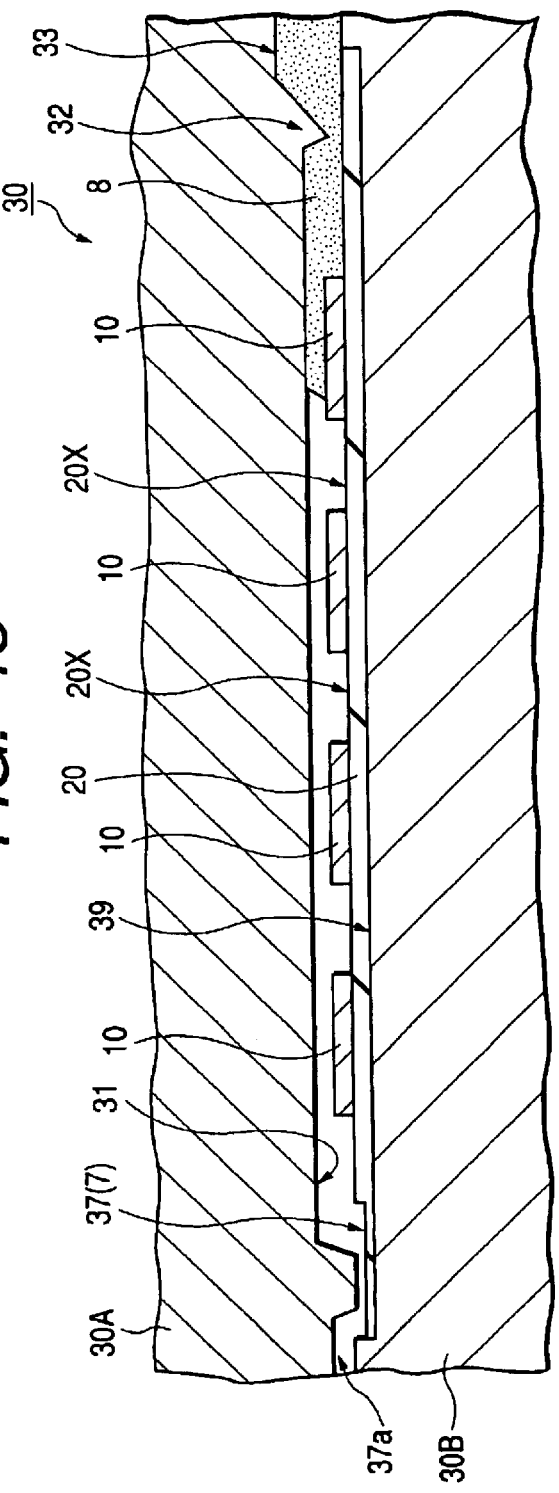
FIG. 13 is a schematic sectional view showing a substrate clamped to a molding die for block molding.
Figure 14:
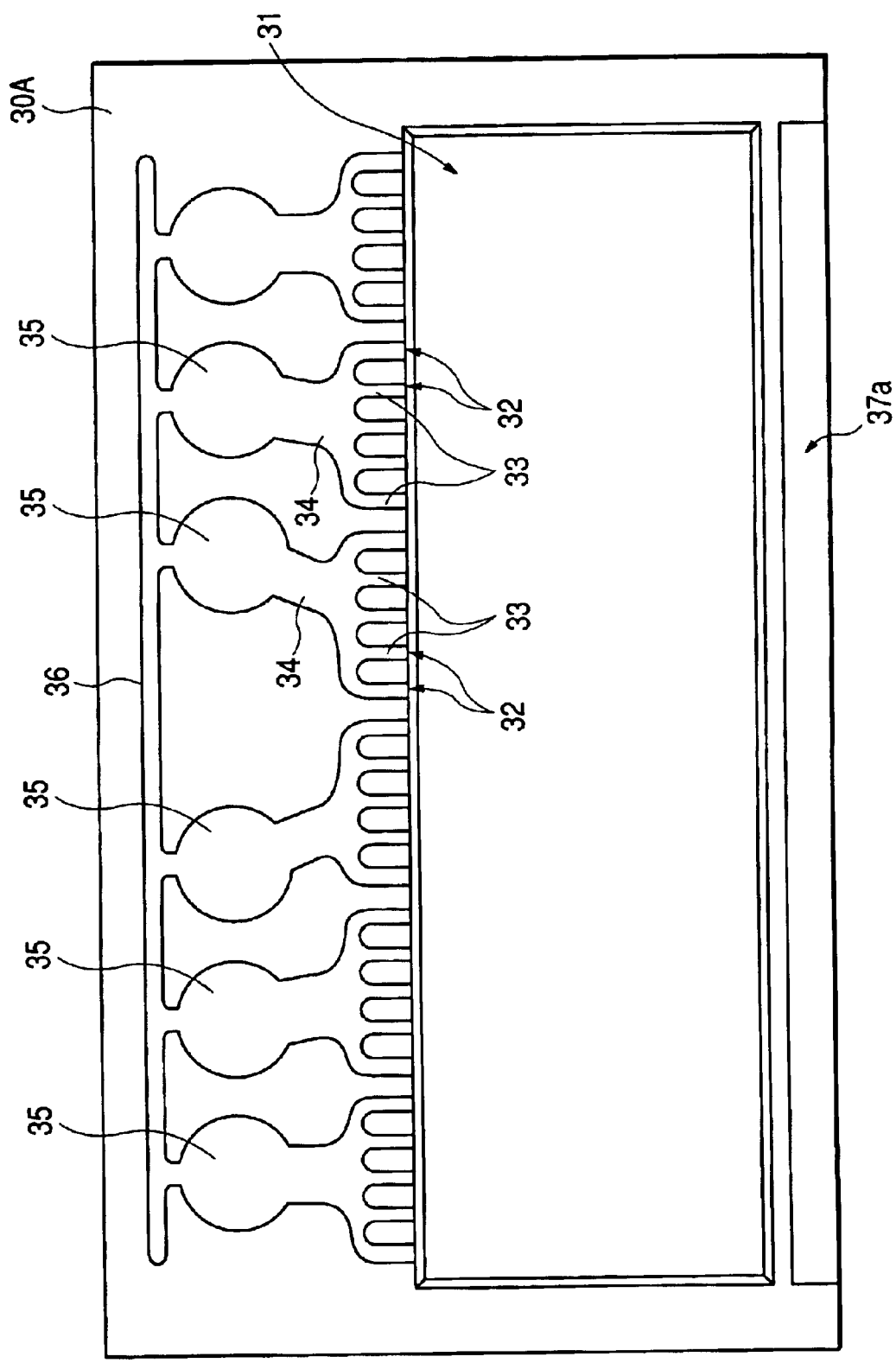
FIG. 14 is a schematic plan view showing a schematic construction of an upper mold of the molding die.
Figure 15:
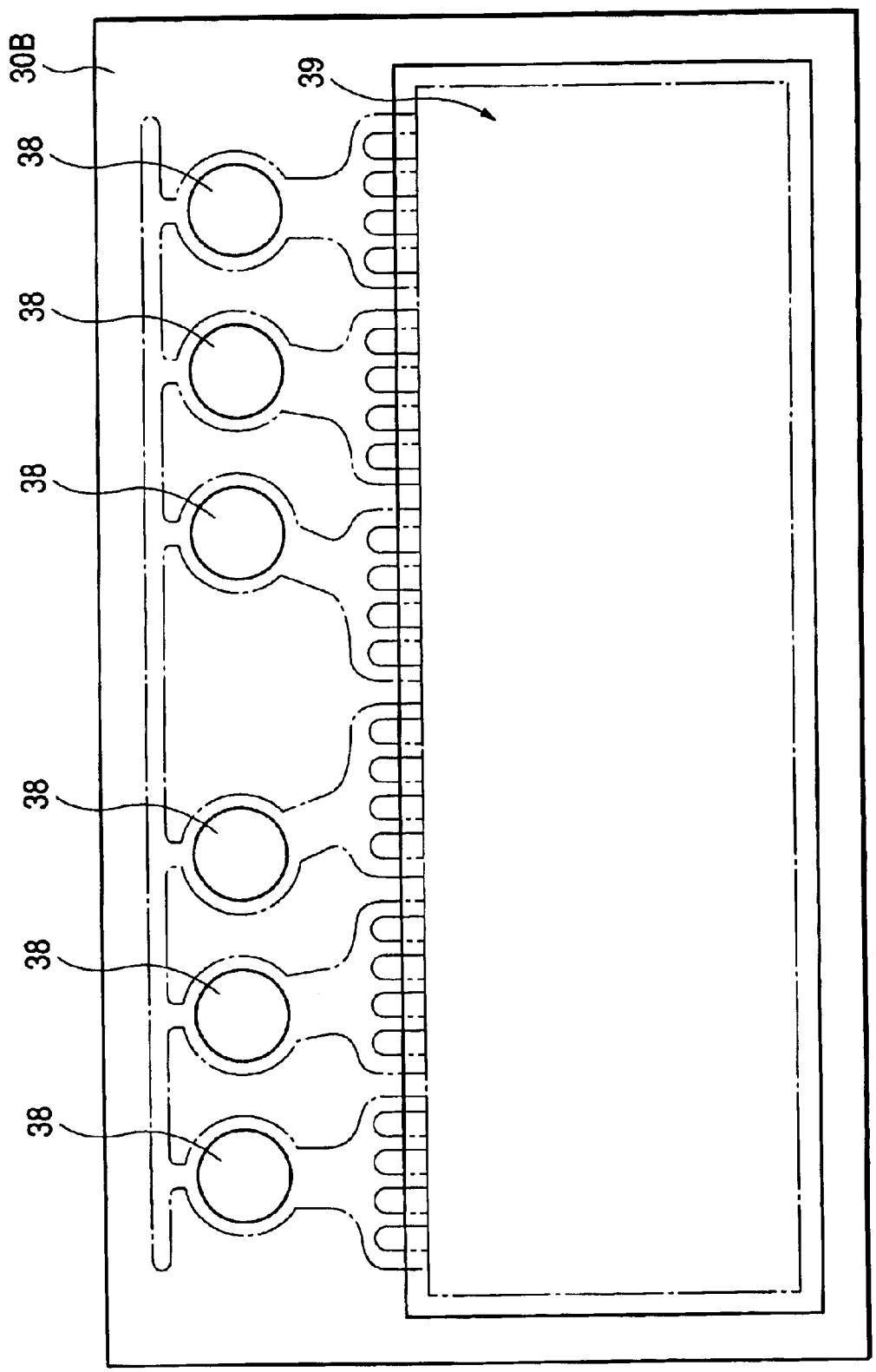
FIG. 15 is a schematic plan view showing a schematic construction of a lower mold of the molding die.

Next, as shown in FIG. 13, the substrate 20 having been subjected to chip bonding and wire bonding is clamped to the molding die 30 in the transfer molding equipment. The molding die 30 has such a structure as shown in FIGS. 14 and 15. FIG. 14 is a schematic plan view showing a schematic construction of an upper mold 30A as a constituent of the molding die 30, FIG. 15 is a schematic plan view showing a schematic construction of a lower mold 30B as a constituent of the molding die 30, and FIG. 16 is a schematic sectional view showing a clamping state of the molding die 30.

Figure 16:
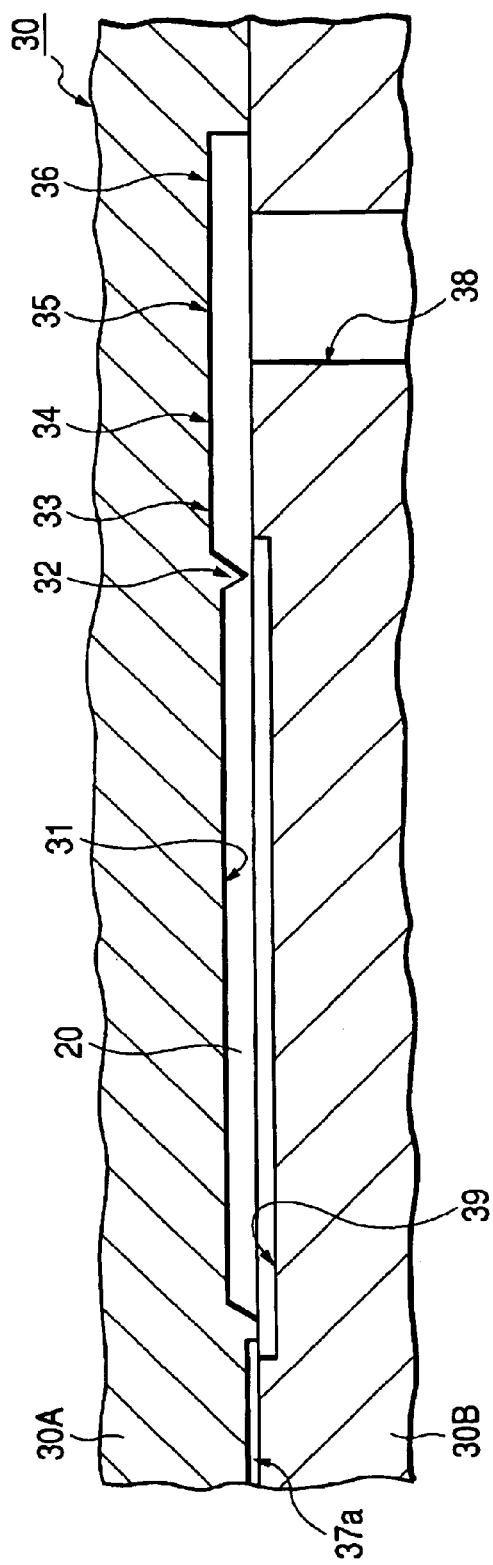
FIG. 16 is a schematic sectional view showing a clamped state of the molding die.

As shown in FIGS. 14 to 16, the molding die 30 is provided with a cavity 31, plural gates 32, plural sub runners 33, plural main runners 34, plural culls 35, plural connecting runners 36, plural pots 38, and a substrate mounting area 39. The components 31 to 36 are provided in the upper mold 30A as shown in FIG. 14, while the components 38 and 39 are provided in the lower mold 30B as shown in FIG. 15.

Plural air vents 37 are formed along another side (opposite side) of the cavity 31 opposite to one side of the cavity where the gates 32 are formed. As shown in FIG. 16, the air vents 37 are formed by grooves 7 formed in a peripheral edge of the substrate 20 and a parting surface of the upper mold 30A. It is necessary that the entire peripheral edge of the substrate 20 be defined by the substrate mounting area 39 formed by a recess and that the grooves 7 constitute air vents. For this reason, as shown in FIGS. 13, 14 and 16, a common air vent portion 37a communicating with the grooves 7 of the substrate 20 as mounted is formed in the parting surface of the upper mold 30A. That is, as shown in FIG. 13, by mounting and clamping the substrate 20 onto the substrate mounting area 39, the cavity 31 and the common air vent portion 37a come into communication with each other through the grooves 7.

The molding die having the common air vent portion 37a is applicable even to substrates 20 having different arrangements of chip mounting areas 23 insofar as the substrates are of the same external size. Thus, the versatility of the molding die is not impaired. Wires are not shown in FIG. 13.

As shown in FIG. 14, the sub runners 33, in other words, gates 32, are provided in a large number more densely than the arrangement pitch of semiconductor chips, i.e., the arrangement pitch of chip mounting areas 23. Therefore, for example the pitch of gates 32 is shorter than one side of each semiconductor chip 10.

In the molding die 30 thus constructed, the resin 8 of an epoxy resin is injected into the cavity 31 from the pots 38 through main runners 34, sub runners 33 and gates 32. The plural gates 32 permit the whole interior of the cavity 31 to be filled with the resin uniformly. Since plural gates 32 are arranged in a closely spaced relation along one of two mutually opposed long sides of the cavity 31, the resin is injected uniformly from one long side toward the opposite long side of the cavity.

A maximum particle diameter of the filler contained in the sealing resin is set larger than the height of the air vents 37 so that the resin 8 may not flow out of the air vents more than necessary.

Figure 17:
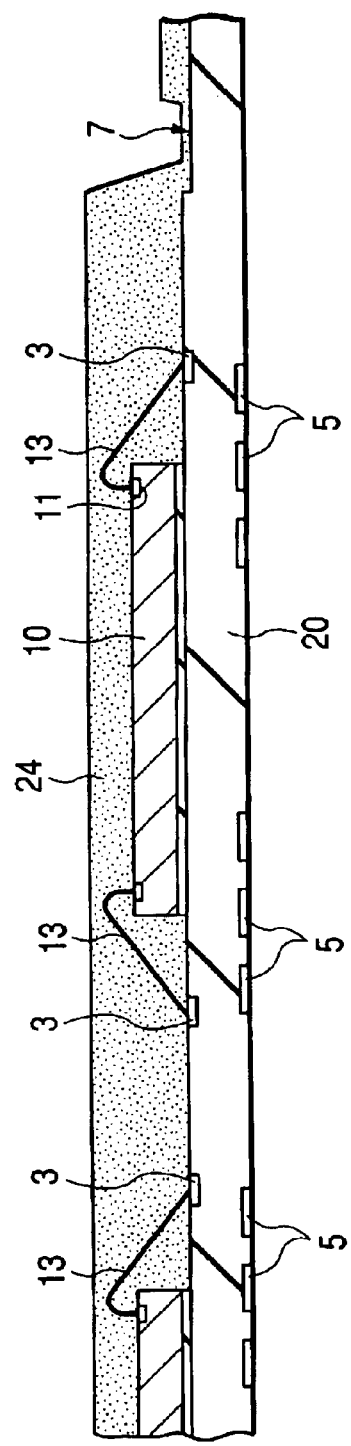
FIG. 17 is a schematic sectional view of the substrate with a resin seal member (package) formed on the main surface side.

As a result of block molding by the transfer molding equipment, one main surface 20X side of the substrate 20 is covered with a resin seal member (block molding package) 24 having a constant thickness, as shown in FIG. 17.

Next, as shown in FIG. 18, salient electrodes 15 are formed, for example by a ball supply method, on the surfaces of electrode pads 5 arranged on the back surface of the substrate 20.

Next, as shown in FIG. 19, the substrate 20 is bonded and fixed to a dicing sheet 25 in a state in which the resin seal member 24 formed by block molding confronts the dicing sheet 25. Thereafter, with a dicing device (not shown), the resin seal member 24 and the substrate 20 are divided simultaneously for each semiconductor chip 10 (each product forming area). As a result of this dividing step, the substrate 20 is divided into substrates 2 and the resin seal member 24 is divided into resin seal members 14. Then, the dicing sheet 25 and the resin seal members 14 are separated from each other, whereby such a semiconductor device 1A as shown in FIG. 6(B) can be manufactured in a large number.

The following effects are obtained by this first embodiment.

(1) Since the air vents 37 can be constituted by grooves 7 formed in the substrate 20, it is no longer necessary for the molding die 30 to be provided with the air vents 37 and hence the versatility (sharing) of the molding die 30 can be attained. As a result, the manufacturing cost of the semiconductor device 1A can be reduced.

(2) Since the grooves 7 can be formed correspondingly to the arrangement of chips on the substrate 20 and are positioned respectively on extensions of chip column areas of semiconductor chips 10 fixed to the product forming areas 22, not positioned on extensions of chip-column-to-chip-column areas, voids and unfilling of resin are difficult to occur. Consequently, it becomes possible to form a package of high quality and hence possible to reduce the manufacturing cost of the semiconductor device 1A.

(3) Since a material is provided selectively on the surface of the base material which constitutes the substrate 20 and the grooves 7 are each formed by a portion not provided with the said material and portion located on both sides thereof and not provided with the said material, not only the grooves 7 can be formed accurately and easily but also the cost of the substrate can be kept low.

(4) Since the maximum particle diameter of the filler contained in the sealing resin 8 is larger than the height of each air vent 37, not only the resin containing voids can be guided surely to the outside of the cavity 31, but also the resin can be prevented from flowing out more than necessary from the air vents 37, whereby a wasteful consumption of the resin can be prevented.

(5) By forming plural areas not provided with air vents 37, i.e., areas where the aforesaid material is provided selectively on the surface of the base material, along a long side of the substrate 20, the base material comes into contact with the upper mold 30A of the molding die 30, whereby it is possible to prevent the occurrence of such problems as warping and floating of the substrate 20 in its peripheral portion and the resulting stopped-up state of the air vents 37. Besides, it is possible to present the occurrence of unfilled portions and voids in the resin seal member 14.

Second Embodiment

Figure 20:
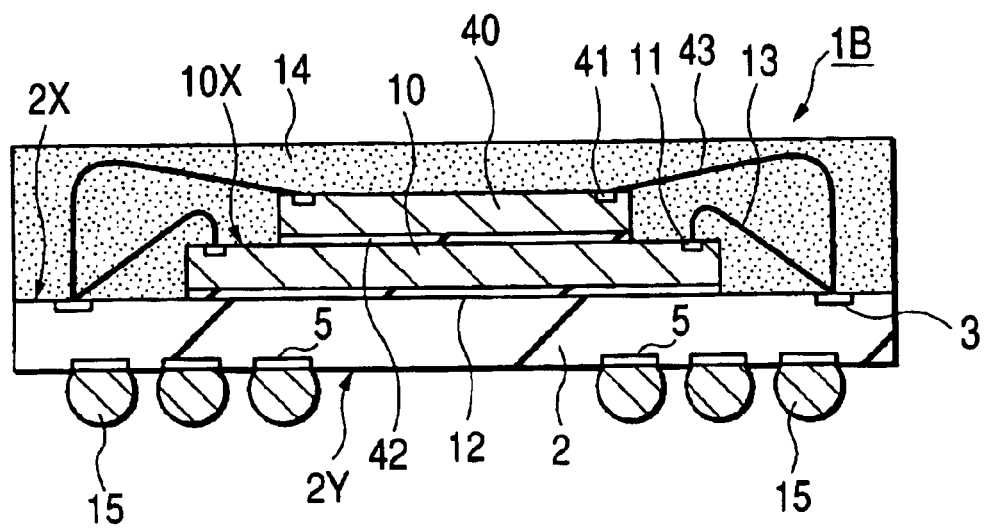
FIG. 20 is a schematic sectional view showing a semiconductor device manufactured by a semiconductor device manufacturing method according to another embodiment (second embodiment) of the present invention.

FIG. 20 is a schematic sectional view of a semiconductor device manufactured by a semiconductor device manufacturing method according to another embodiment (second embodiment) of the present invention.

The semiconductor device according to this second embodiment, indicated at 1B, comprises plural semiconductor chips stacked on a main surface of a substrate 2. Therefore, wiring patterns capable of corresponding to the plural chips are formed on the substrate 2.

In the semiconductor device 1B, a semiconductor chip 10 is bonded and fixed onto one main surface 2X of the substrate 2 through an adhesive layer 12 and a semiconductor chip 40 is bonded and fixed onto one main surface 10X of the semiconductor chip 10 through an adhesive layer 42. The semiconductor chip 42 is formed in a planar size smaller than the semiconductor chip 10. Electrode pads 41 arranged on one main surface of the semiconductor chip 40 are electrically connected through wires (bonding wires) 43 to connecting portions 3 formed on one main surface 20X of the substrate 20. The semiconductor chips 10 and 40 are sealed with a resin seal member 14.

In connection with the semiconductor device 1B, a characteristic feature resides in that in the manufacturing process of the first embodiment the semiconductor chips 10 and 40 are fixed one on the other in each chip mounting area 23. More specifically, in the substrate 20 used in the first embodiment, the semiconductor chip 10 is bonded and fixed to each chip mounting area 23 on the substrate 20 through the adhesive layer 12 and thereafter the semiconductor chip 40 is bonded and fixed to one main surface 10X of the semiconductor chip 10 through the adhesive layer 42. In this case, the semiconductor chip 42 is smaller than the semiconductor chip 10, and when the semiconductor chip 40 is fixed onto the semiconductor chip 10, electrode pads (bonding pads) 11 on the semiconductor chip 10 are exposed without being covered with the semiconductor chip 40.

Next, the electrode pads 11 of the semiconductor chip 10 and the connecting portions 3 of the substrate 20 are connected together through wires 13. Likewise, the electrode pads 41 of the semiconductor chip 40 and the connecting portions 3 of the substrate 20 are connected together through wires 43.

Next, a resin seal member 24 is formed by block molding one main surface 20X side of the substrate 20 in the same manner as in the first embodiment, thereafter, salient electrodes 15 are formed on electrode pads 5 on the back surface of the substrate 20, and then the substrate 20 and the resin seal member 24 are divided into substrates 2 and resin seal members 14, affording plural such semiconductor devices 1B as shown in FIG. 20.

According to this second embodiment, since the semiconductor device 1B has a multi-chip module (MCM) structure, it is possible to improve the function as a semiconductor device.

According to this second embodiment, for example in order to realize about the same device (product) height as the semiconductor device 1A described in the previous first embodiment it is necessary, for sealing stacked chips within the same thickness of the resin seal member 14, that the wire loop height be made low by adopting, for example, such a reverse bonding method as illustrated and that the thickness from the main surface of the semiconductor chip 40 located as an upper layer up to the surface of the resin seal member be made small.

However, if the block molding method is adopted in such a construction, the distance between the upper surface of the cavity 31 and the main surface of the semiconductor chip 40 becomes more and more short and the flow resistance of resin 8 in each chip column area becomes large, so that the difference in resin injection speed between chip column areas and chip-column-to-chip-column areas becomes very large and an unfilled area of resin is apt to occur more easily in an extending direction of each chip column area. Accordingly, the application of the arrangement of air vents 37 based on the present invention becomes more important.

Third Embodiment

Figure 21:
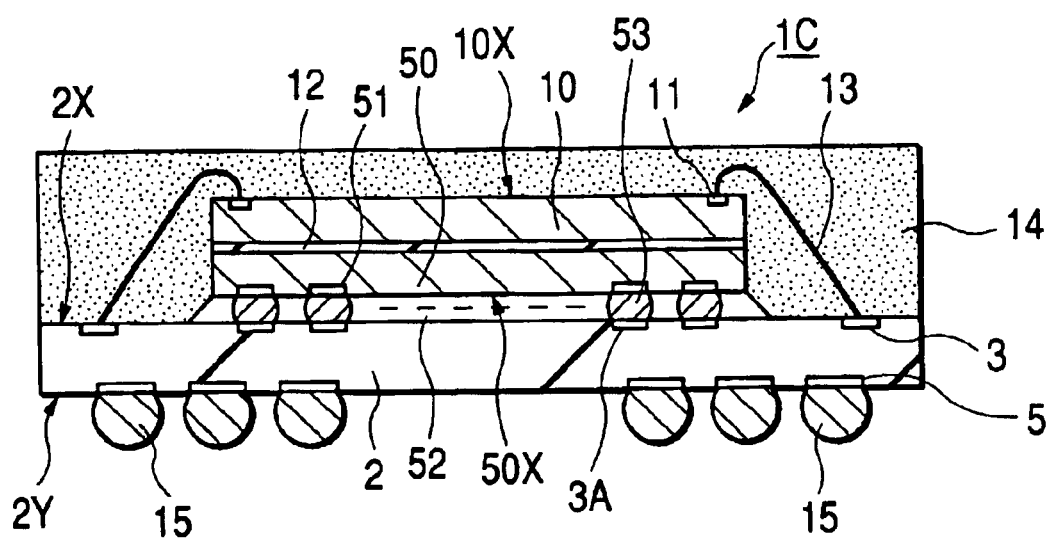
FIG. 21 is a schematic sectional view showing a semiconductor device manufactured by a semiconductor device manufacturing method according to a further embodiment (third embodiment) of the present invention.

FIG. 21 is a schematic sectional view showing a semiconductor device manufactured by a semiconductor device manufacturing method according to a further embodiment (third embodiment) of the present invention.

The semiconductor device according to this third embodiment, indicated at 1C, is of the same type as that of the second embodiment, in which plural semiconductor chips are stacked on the substrate 2. Therefore, wiring patterns capable of corresponding to this stacked construction are formed on the substrate 2.

Although the semiconductor device 1C according to this third embodiment shows an example in which plural semiconductor chips are stacked on a main surface of the substrate 2, it is provided, unlike the second embodiment, with a semiconductor chip 50 which is fixed directly to the substrate 2 by face-down bonding and a semiconductor chip 10 which is fixed stackedly onto the semiconductor chip 50.

More specifically, the semiconductor chip 50 has salient electrodes 53 which are superimposed on electrode pads 51 formed on a main surface 50X of the semiconductor chip, the salient electrodes 53 being facedown-bonded to connecting portions (lands) 3A formed on one main surface 2X of the substrate 2 to effect electrical and mechanical fixing of the semiconductor chip 50. A gap as a facing portion between the semiconductor chip 50 and the substrate 2, which gap is deviated from the salient electrodes 53, is filled with an insulating resin (under-fill resin) 52.

The semiconductor chip 10 is fixed onto the semiconductor chip 50 through an adhesive layer 12 so that electrode pads (bonding pads) 11 of the semiconductor chip 10 face upward. Consequently, it becomes possible to effect wire bonding, and electrode pads 11 of the semiconductor chip 10 and connecting portions (lands) 3 of the substrate 2 are connected together through wires 13 as in the first embodiment. The main surface side of the substrate 2 is sealed with a resin seal member 14.

In manufacturing the semiconductor device 1C, the semiconductor chip 50 is facedown-bonded to each chip mounting area 23 on the substrate 20 and the facing portion between the semiconductor chip 50 and the substrate 2 is filled with an insulating resin (under-fill resin) 52. With this facedown bonding, the electrode pads 51 on the semiconductor chip 50 are connected electrically to the connecting portions (lands) 3 of the substrate 2 through the salient electrodes 53.

Further, the semiconductor chip 10 is fixed onto the semiconductor chip 50 through the adhesive layer 12 so that the electrode pads (bonding pads) 11 of the semiconductor chip 10 face upward. Thereafter, the electrode pads (bonding pads) 11 and the connecting portions (lands) 3 of the substrate 2 are electrically connected together through electrically conductive wires 13.

In fixing the overlying semiconductor chip 10, it suffices for the underlying semiconductor chip 50 serve as a mere support for the semiconductor chip 10, with no need of exposing the electrode pads 51 as in the second embodiment. Therefore, it is not necessary that the overlying semiconductor chip 10 be made smaller than the underlying semiconductor chip 50, thus permitting large sizes of semiconductor chips to be stacked within the semiconductor device. Consequently, it is possible to attain a high function of the semiconductor device 1C.

After the completion of chip bonding and wire bonding, a resin seal member 24 (package) is formed by block molding in the same way as in the first embodiment and salient electrodes 15 are formed on electrode pads 5 arranged on the back surface of the substrate 20, then the substrate 20 and the resin seal member 24 are divided into substrates 2 and resin seal members 14, thereby fabricating plural such semiconductor devices 1C as shown in FIG. 21.

According to this third embodiment, since the semiconductor device 1C has a multi-chip module (MCM) structure, it is possible to improve the function as a semiconductor device. Besides, as in the previous second embodiment, the flow resistance of resin 8 in each chip column area becomes large, so that the application of the arrangement of air vents 37 based on the present invention becomes more essential.

Although the present invention has been described above concretely by way of embodiments thereof, it goes without saying that the invention is not limited to the above embodiments and that various modifications may be made within the scope not departing from the gist thereof. For example, although the substrate 20 used in the embodiments is a glass fabric-based epoxy resin substrate as an example, the present invention is effective also in case of using a BT resin substrate as the substrate 20.

The present invention is applicable at least to a semiconductor device manufacturing technique which adopts block molding.

The grooves 7 formed in the substrate 20 according to the present invention need not be connected to an end portion of the substrate 20 insofar as they are opening portions which are open to the exterior so as to function as air vents. For example, even if the grooves 7 are connected to the interior of the common air vent portion 37a from the interior of the cavity 31 and are terminated in the interior of the common air vent portion, they will do if only they are open to the exterior through the common air vent portion 37a.

Figure 26:
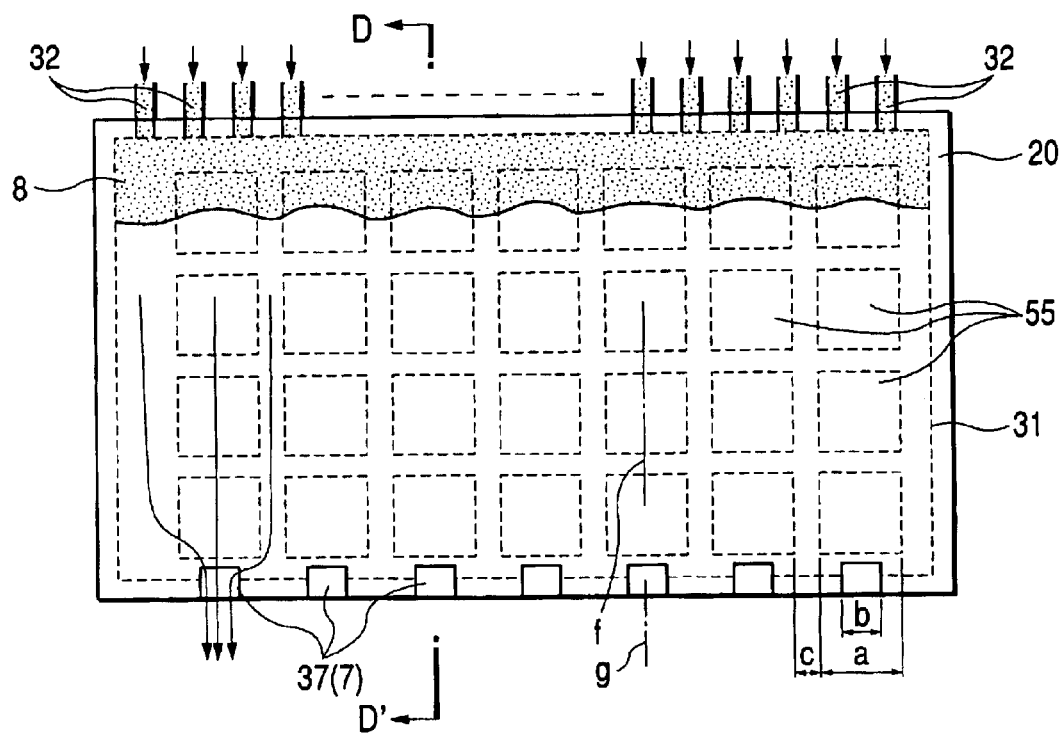
FIG. 26 is a schematic diagram showing an arrangement relation of semiconductor chips on a main surface of a substrate, as well as an arrangement relation of chip columns to air vents and gates, in a block molding state in a further embodiment of the present invention.
Figure 27:
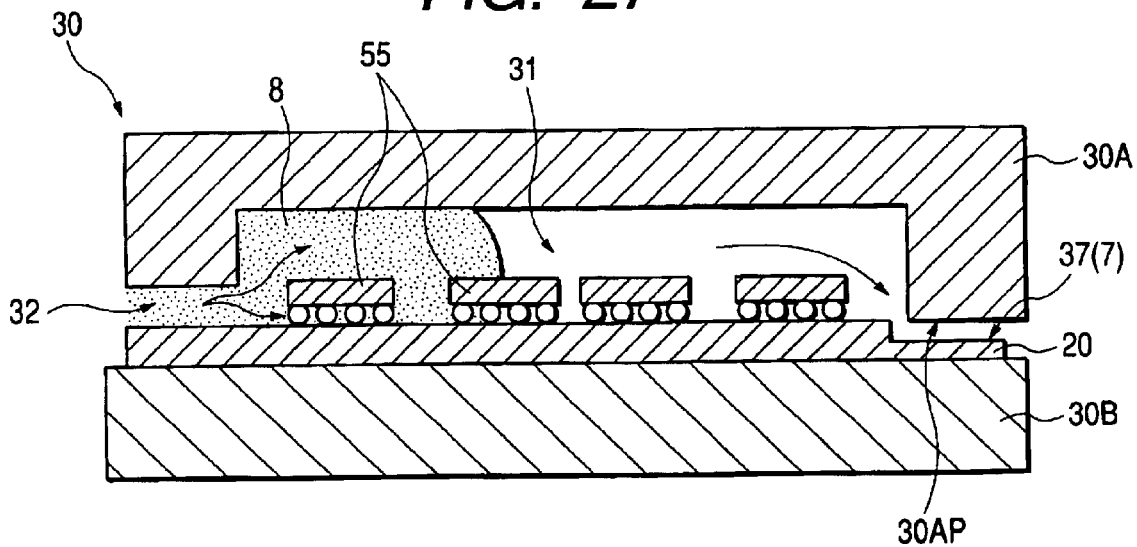
FIG. 27 is a sectional view taken on line D–D' in FIG. 26.

In the block molding method, as shown in FIGS. 26 and 27, not only the upper and side portions of semiconductor chips are sealed, but also the space between main surfaces of semiconductor chips 55 mounted by a flip chip method and the substrate 20 can also be filled with resin 8 simultaneously. But, also in this case, since the flow resistance of resin 8 in each chip column area is larger than in each chip-column-to-chip-column area, the application of the arrangement of air vents 37 based on the present invention is effective.

Figure 28:
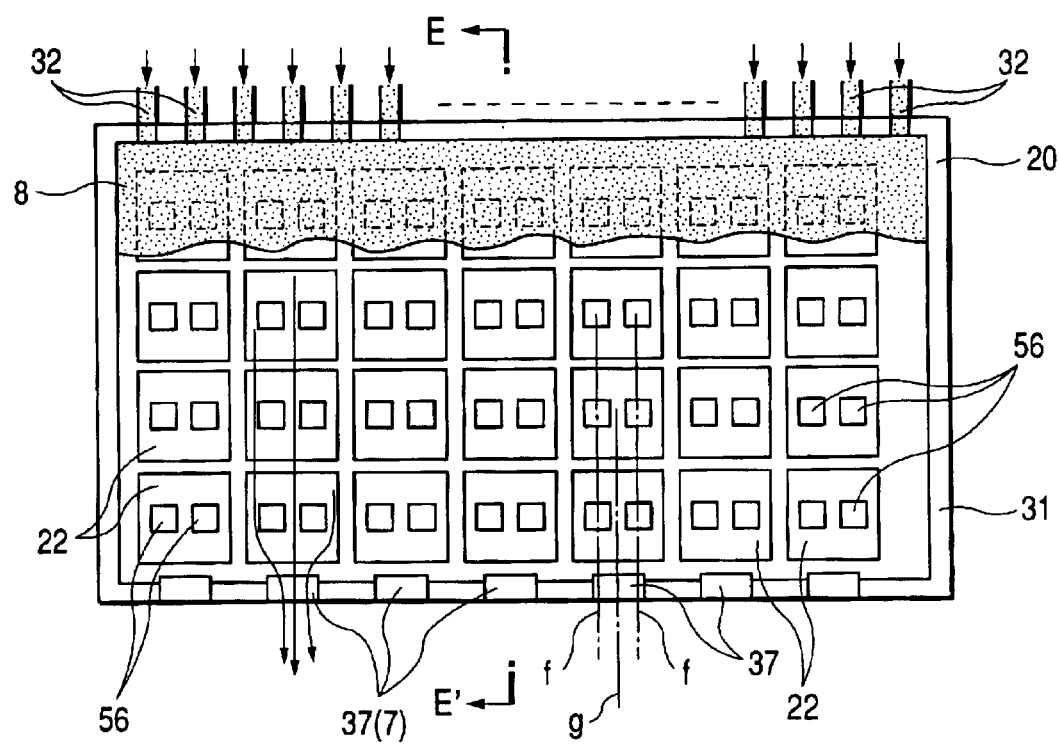
FIG. 28 is a schematic diagram showing an arrangement relation of semiconductor chips on a main surface of a substrate, as well as an arrangement relation of chip columns to air vents and gates, in a block molding state in a further embodiment of the present invention.
Figure 29:
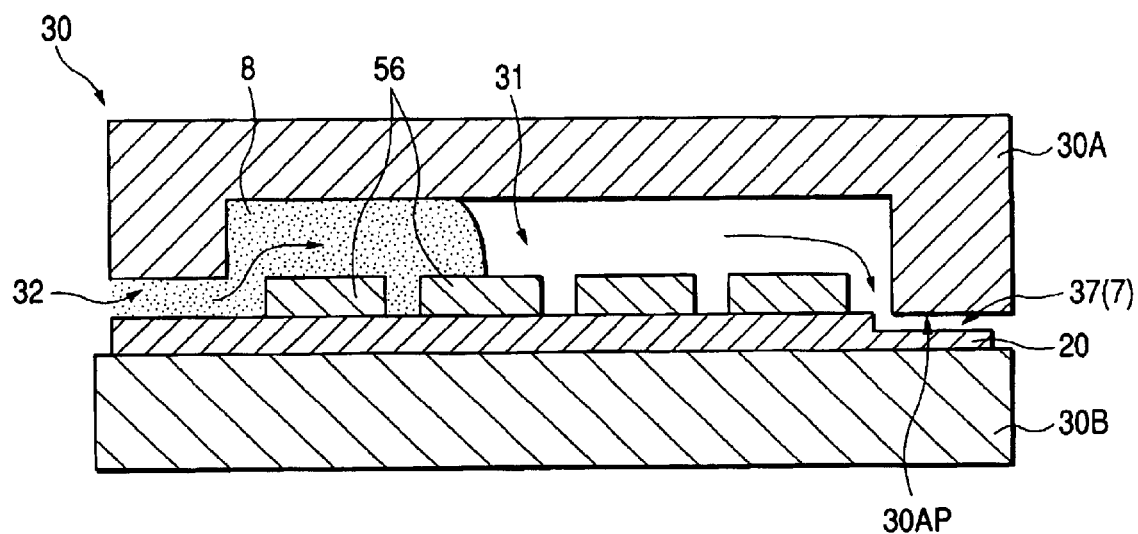
FIG. 29 is a sectional view taken on line E–E' in FIG. 28.

As shown in FIGS. 28 and 29, the present invention is also applicable to an MCM type semiconductor device having a construction in which plural semiconductor chips 56 are arranged side by side in each product forming area on the main surface of the substrate 20. In such a case, an area may be formed between the semiconductor chips 56 arranged in each product forming area. If the reduction in size of product is to be attained, it is necessary that such an area, or a spacing, between the semiconductor chips 56 in each product forming area be formed narrower than each chip-column-to-chip-column area including an isolation area which isolates adjacent product forming areas from each other.

In such an area as a narrow spacing between semiconductor chips 56, the flow resistance of resin 8 is large as compared with that in each chip-column-to-chip-column area, so that unfilling of resin or voids may occur behind the area in question. In this case, for preventing the occurrence of such unfilling of resin and voids, it is necessary that the above area as a spacing, including semiconductor chips adjacent to the said area, be regarded as an aggregate (a semiconductor chip aggregate) which acts as a flow resistance of resin 8 and that an air vent 37 be formed on an extension of each area where the semiconductor chip aggregate is arranged.

The following is a brief description of effects obtained by typical inventions disclosed herein.

(1) In the MAP method, the grooves for forming air vents are provided in a substrate, so air vents can be formed in positions corresponding respectively to semiconductor chip columns, with consequent improvement of yield without the occurrence of voids and unfilling of resin during molding, thus permitting reduction of the semiconductor device manufacturing cost.

(2) In the MAP method, since air vents can be formed by grooves provided in a substrate, it is, unlike the prior art, no longer required for a molding die to be provided with grooves for air vents, with the result that the versatility of the molding die is improved and the mold cost can be reduced. Accordingly, the cost of the semiconductor device manufactured can also be reduced.

What is claimed is:

1. A method of manufacturing a semiconductor device, comprising the steps of:

providing a substrate, the substrate having a plurality of product forming areas arranged regularly on a main surface thereof and also having wiring lines formed on main surfaces and back surfaces opposite thereto of the product forming areas, the wiring lines on the main surfaces and the wiring lines on the back surfaces being electrically connected with each other through conductors which extend through the substrate from the main surfaces to the back surfaces;

fixing semiconductor chips respectively to the product forming areas on the main surface of the substrate and connecting electrodes formed on upper surfaces of the semiconductor chips with the wiring lines formed on the main surface of the substrate electrically using electrically conductive connecting means;

clamping the substrate between a lower mold and an upper mold of a molding die in transfer molding equipment to form a cavity on the main surface side of the substrate, as well as gates and air vents connected to the cavity, then feeding molten insulating resin into the cavity through the gates and at the same time forcing out air present within the cavity to the exterior of the cavity through the air vents to form a block molding package on the main surface side of the substrate, the block molding package being formed of a single resin and covering the semiconductor chips and the connecting means; and dividing the substrate and the block molding package, which are superimposed one on the other, longitudinally and transversely at predetermined positions to form plural semiconductor devices, wherein grooves reaching an edge of the substrate are partially formed in a peripheral edge portion of the substrate so that the grooves form the air vents when the substrate is clamped between the lower and upper molds of the molding die.

2. The method according to claim 1, wherein a parting surface of the upper mold in contact with the substrate is positioned on the same plane exclusive of the gate portions, comes into contact with the main surface of the substrate when the substrate is clamped, and defines the air vents in cooperation with the grooves.

3. The method according to claim 1, wherein inner ends of the grooves are positioned inside the cavity with respect to an edge of the cavity.

4. The method according to claim 3, wherein the inner ends of the grooves are arranged inside the cavity at a position of about 100 $\mu$m to 1 mm from the edge of the cavity.

5. The method according to claim 1, wherein the product forming areas are arranged longitudinally and transversely in a plural number.

6. The method according to claim 5, wherein the substrate is in a quadrangular shape, the product forming areas are also each in a quadrangular shape, and one side of each of the product forming areas is parallel to one side of the substrate.

7. The method according to claim 5, wherein the grooves are positioned respectively on extensions of chip column areas of the semiconductor chips fixed to the product forming areas.

8. The method according to claim 5, wherein the grooves are not provided on extensions of chip-column-to-chip-column areas of the semiconductor chips fixed to the product forming areas.

9. The method according to claim 5, wherein the width of each of the grooves is smaller than the width of each of the semiconductor chips.

10. The method according to claim 9, wherein the width of each of the grooves is about half of the width of each of the semiconductor chips.

11. The method according to claim 1, wherein the depth of each of the grooves is about 50 $\mu$m.

12. The method according to claim 1, wherein the grooves are provided on a side opposite to the gates with respect to the cavity.

13. The method according to claim 1, wherein the grooves are formed on three sides of the cavity which is quadrangular in shape, exclusive of the side where the gates are formed.

14. The method according to claim 1, wherein the connecting means are electrically conductive wires.

15. The method according to claim 1, wherein a plurality of semiconductor chips are mounted on each of the product forming areas.

16. The method according to claim 15, wherein the plural semiconductor chips are mounted in a stacked manner in each of the product forming areas.

17. The method according to claim 1, wherein a material is provided selectively on a surface of a base material which constitutes the substrate, and the grooves are each formed by a portion not provided with said material and portions located on both sides thereof and provided with said material.

18. The method according to claim 17, wherein the grooves are each formed by portions provided with and not provided with a conductor layer on the surface of the base material which constitutes the substrate.

19. The method according to claim 17, wherein the grooves are each formed by portions provided with and not provided with an insulating layer on the surface of the base material which constitutes the substrate.

20. The method according to claim 17, wherein the grooves are each formed by portions provided with and not provided with a conductor layer on the surface of the base material which constitutes the substrate and further by portions provided with and not provided with an insulating layer which covers the wiring lines.

21. The method according to claim 17, wherein the grooves are each formed by portions provided with and not provided with a conductor layer on the surface of the base material which constitutes the substrate and further by a recessed portion of an insulating layer provided on the main surface of the substrate and including the conductor layer.

22. The method according to claim 1, wherein the resin is an epoxy resin or a polyimide resin.

23. The method according to claim 1, wherein an arrangement pitch of the gates is smaller than that of the semiconductor chips.

* * * * *